United States Patent
Kondo et al.

(10) Patent No.: US 10,074,962 B2
(45) Date of Patent: Sep. 11, 2018

(54) GRATING ELEMENT AND EXTERNAL RESONATOR TYPE LIGHT EMITTING DEVICE

(71) Applicant: NGK INSULATORS, LTD., Nagoya (JP)

(72) Inventors: Jungo Kondo, Miyoshi (JP); Shoichiro Yamaguchi, Ichinomiya (JP); Keiichiro Asai, Nagoya (JP); Tetsuya Ejiri, Kasugai (JP); Naotake Okada, Anjo (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/333,487

(22) Filed: Oct. 25, 2016

(65) Prior Publication Data

US 2017/0047711 A1 Feb. 16, 2017

Related U.S. Application Data

(63) Continuation of application No. PCT/JP2015/061385, filed on Apr. 13, 2015.

(30) Foreign Application Priority Data

May 1, 2014 (JP) ................................. 2014-094789

(51) Int. Cl.
*H01S 5/14* (2006.01)
*G02B 6/42* (2006.01)
(Continued)

(52) U.S. Cl.
CPC .............. *H01S 5/141* (2013.01); *G02B 6/122* (2013.01); *G02B 6/124* (2013.01);
(Continued)

(58) Field of Classification Search
CPC .......... H01S 5/125; H01S 5/141; H01S 5/166; G02B 6/124
See application file for complete search history.

(56) References Cited

U.S. PATENT DOCUMENTS 5,513,196 A * 4/1996 Bischel ................... H01S 5/141
                                                    372/102
6,944,192 B2   9/2005 Prassas et al.
(Continued)

FOREIGN PATENT DOCUMENTS

JP   49-128689 A1   12/1974
JP   56-148880 A1   11/1981
(Continued)

OTHER PUBLICATIONS

Tanaka, "hybrid-integrated external-cavity laser without temperature dependent mode hopping" Sep. 2002, Journal of Lightwave Technology, vol. 20, No. 9, pp. 1730-1739.*
(Continued)

*Primary Examiner* — Michael Carter
(74) *Attorney, Agent, or Firm* — Burr & Brown, PLLC

(57) ABSTRACT

A grating element includes: a support substrate; an optical material layer; a ridge optical waveguide having an incidence surface on which a laser light is incident and an emission end from which an emission light with a desired wavelength is emitted; and a Bragg grating including concave and convex portions formed within the optical waveguide. The optical waveguide includes an incident portion between the incidence surface and the Bragg grating, and a tapered portion between the incident portion and the Bragg grating. In the Bragg grating, a propagation light propagates in single mode. The width $W_{in}$ of the optical waveguide in the incident portion is larger than the width $W_{gr}$ of the optical waveguide in the Bragg grating. The width $W_t$ of the optical waveguide in the tapered portion is decreased from (Continued)

the incident portion toward the Bragg grating. The relationships represented by formulas (1) to (3) are satisfied.

16 Claims, 21 Drawing Sheets

(51) Int. Cl.
    *G02B 6/122*     (2006.01)
    *G02B 6/124*     (2006.01)
    *G02B 6/30*     (2006.01)
    *G02B 6/12*     (2006.01)

(52) U.S. Cl.
    CPC ..... *G02B 6/12016* (2013.01); *G02B 6/12019* (2013.01); *G02B 6/305* (2013.01); *G02B 6/42* (2013.01); *G02B 6/1228* (2013.01)

(56) References Cited

U.S. PATENT DOCUMENTS

| | | | |
|---|---|---|---|
| 7,424,044 B2 | 9/2008 | Zheng et al. | |
| 7,463,664 B2 | 12/2008 | Mizuuchi et al. | |
| 2002/0191665 A1* | 12/2002 | Caprara | H01S 3/09415 372/71 |
| 2003/0174956 A1* | 9/2003 | Viens | G02B 6/1228 385/43 |
| 2006/0030842 A1* | 2/2006 | Brandenburg | B82Y 20/00 606/4 |
| 2007/0133636 A1* | 6/2007 | Park | G02B 6/12004 372/45.012 |
| 2012/0099611 A1* | 4/2012 | Kim | H01S 5/141 372/20 |

FOREIGN PATENT DOCUMENTS

| | | |
|---|---|---|
| JP | 10-098230 A1 | 4/1998 |
| JP | 2000-082864 A1 | 3/2000 |
| JP | 2002-134833 A1 | 5/2002 |
| JP | 2002-185076 A1 | 6/2002 |
| JP | 3667209 B2 | 7/2005 |
| JP | 2006-222399 A1 | 8/2006 |
| JP | 4271704 B2 | 6/2009 |
| JP | 2010171252 * | 8/2010 |
| JP | 2013-120999 A1 | 6/2013 |
| WO | 2013/034813 A2 | 3/2013 |

OTHER PUBLICATIONS

Kazunori Yamada, et al., "Highly Accurate Wavelength Control of External Cavity Laser Module with Fiber Grating," Transactions on Fundamentals of Electronics, Communications and Computer Science, C-II, vol. J81, No. 7, Jul. 1998, pp. 664-665.

Yujin Zheng, et al., "High-Brightness Narrow-Bandwidth High-Power Laser-Diode Array Based on an External-Cavity Technique," Technical Reports on Fundamentals of Electronics, Communications and Computer Sciences, LQE, 2005, vol. 105, No. 52, pp. 17-20.

Akira Mugino, et al., "Output Power Optimization of 980 nm Pump Lasers Wavelength-Locked Using Fiber Bragg Grating," Furukawa Review, Jan. 2000, vol. 105, pp. 24-29.

International Search Report and Written Opinion (Application No. PCT/JP2015/061385) dated Jun. 30, 2015.

U.S. Appl. No. 15/375,475, filed Dec. 12, 2016, Kondo et al.

English translation of International Preliminary Report on Patentability (Chapter I) (Application No. PCT/JP2015/061385) dated Nov. 10, 2016, 8 pages.

German Office Action (Application No. 11 2015 002 094.2) dated Jul. 2, 2018.

Jul. 10, 2018 Letter from Applicant's German Representative.

* cited by examiner

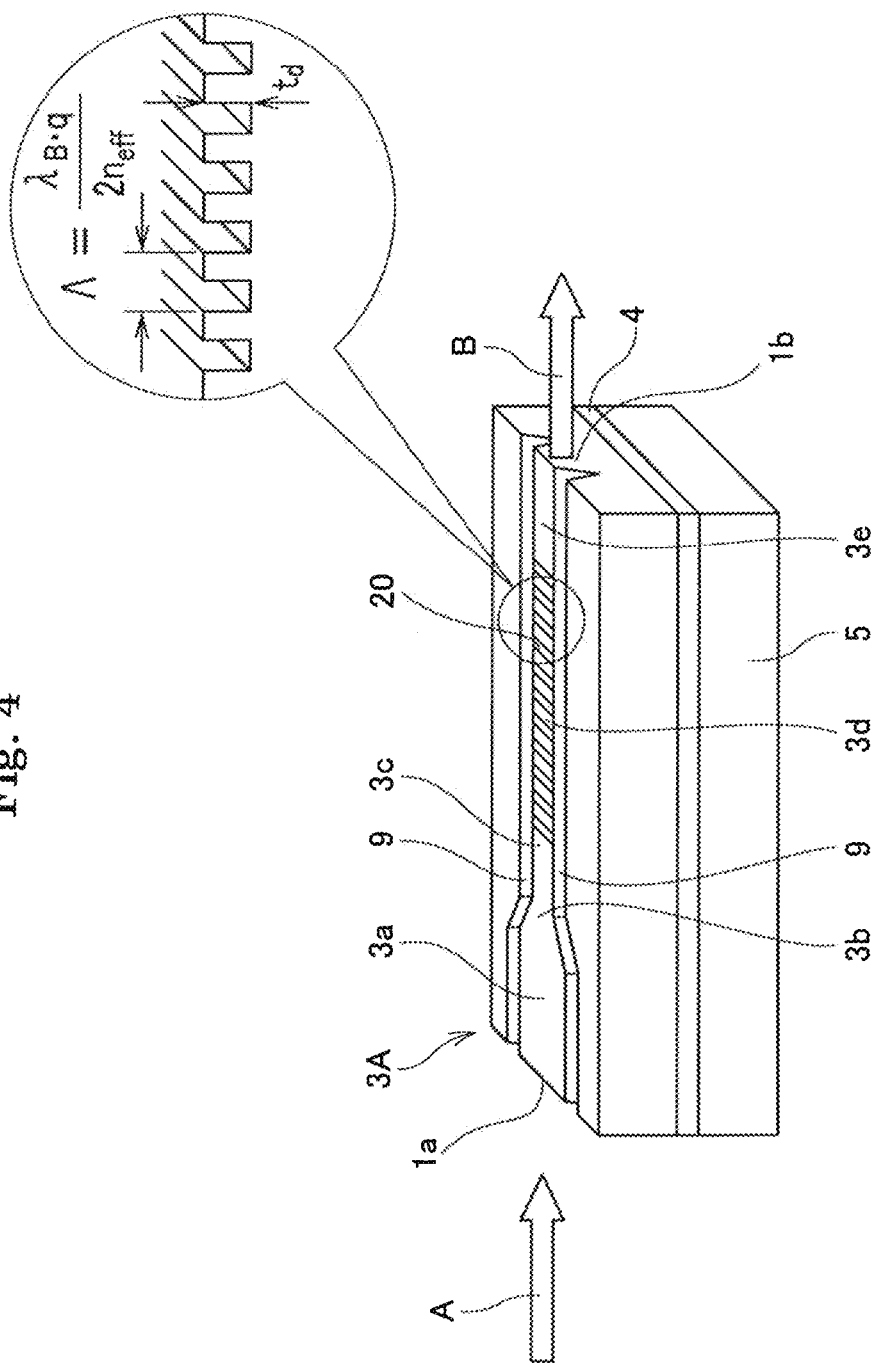

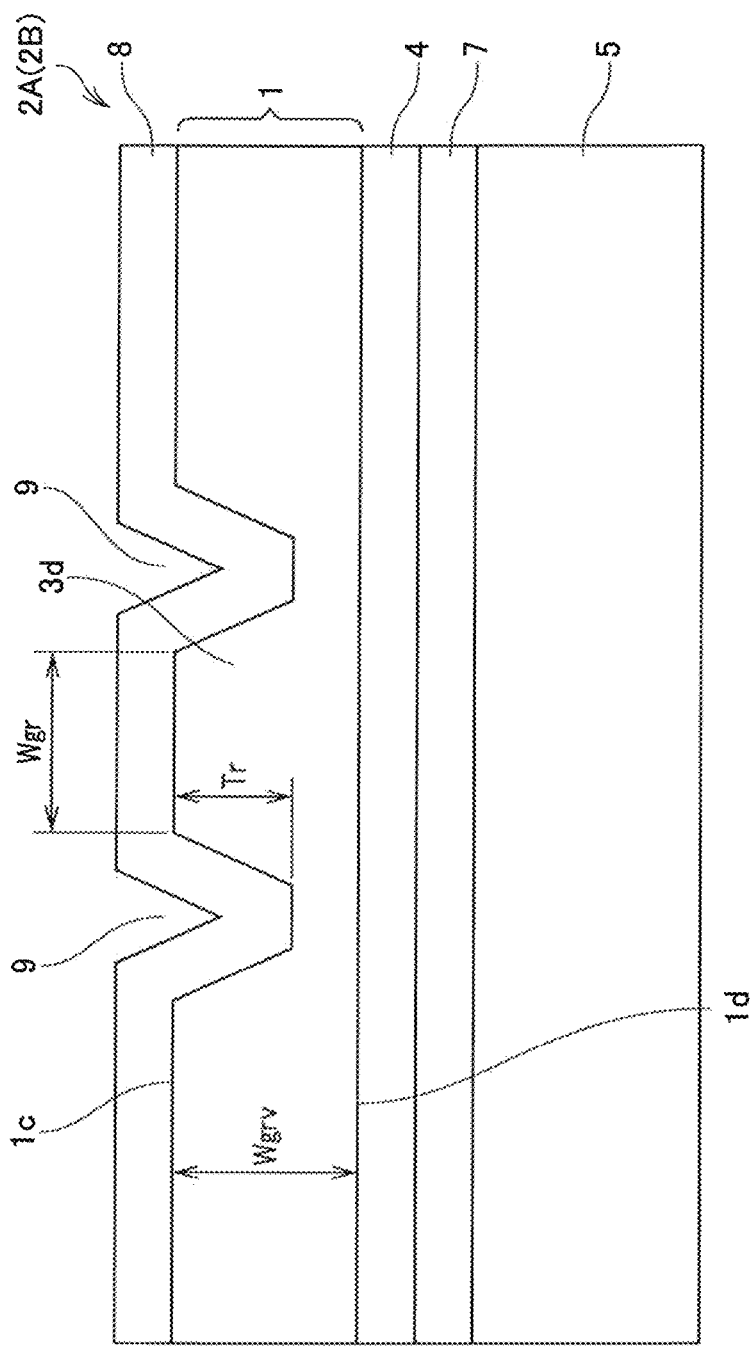

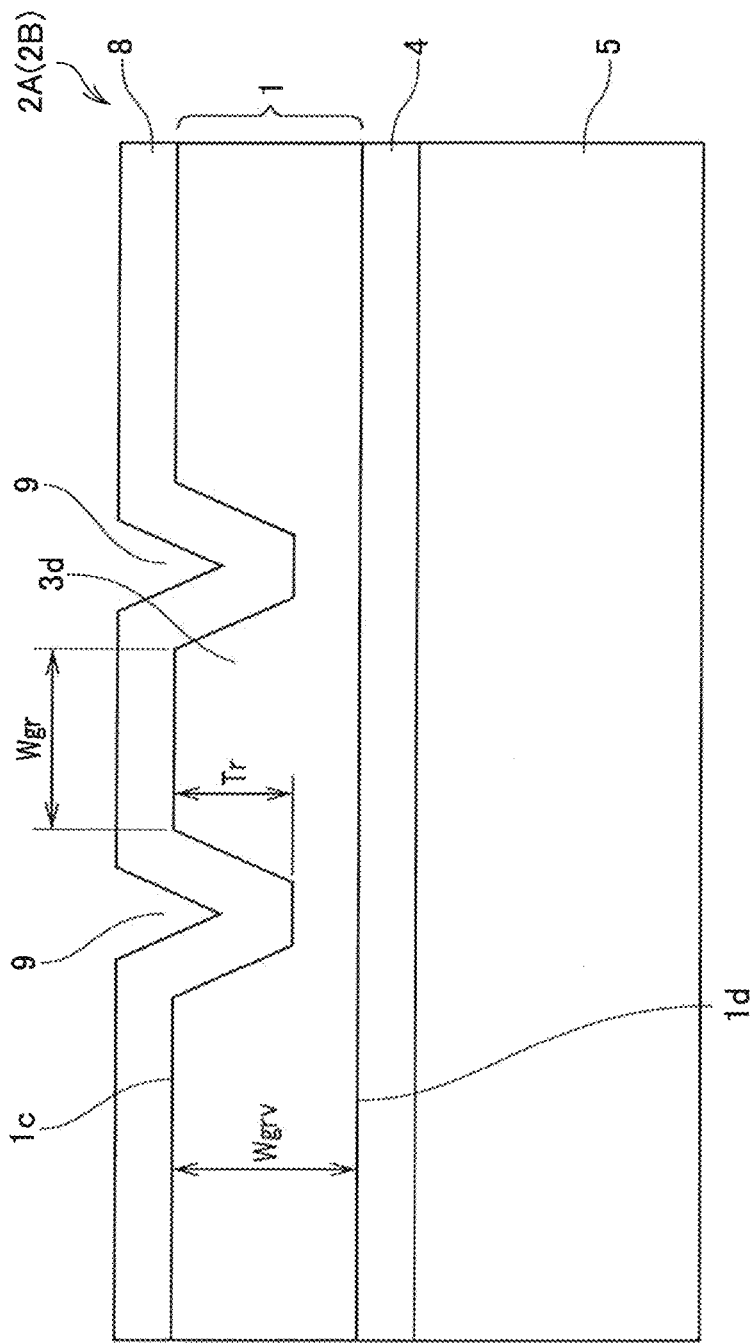

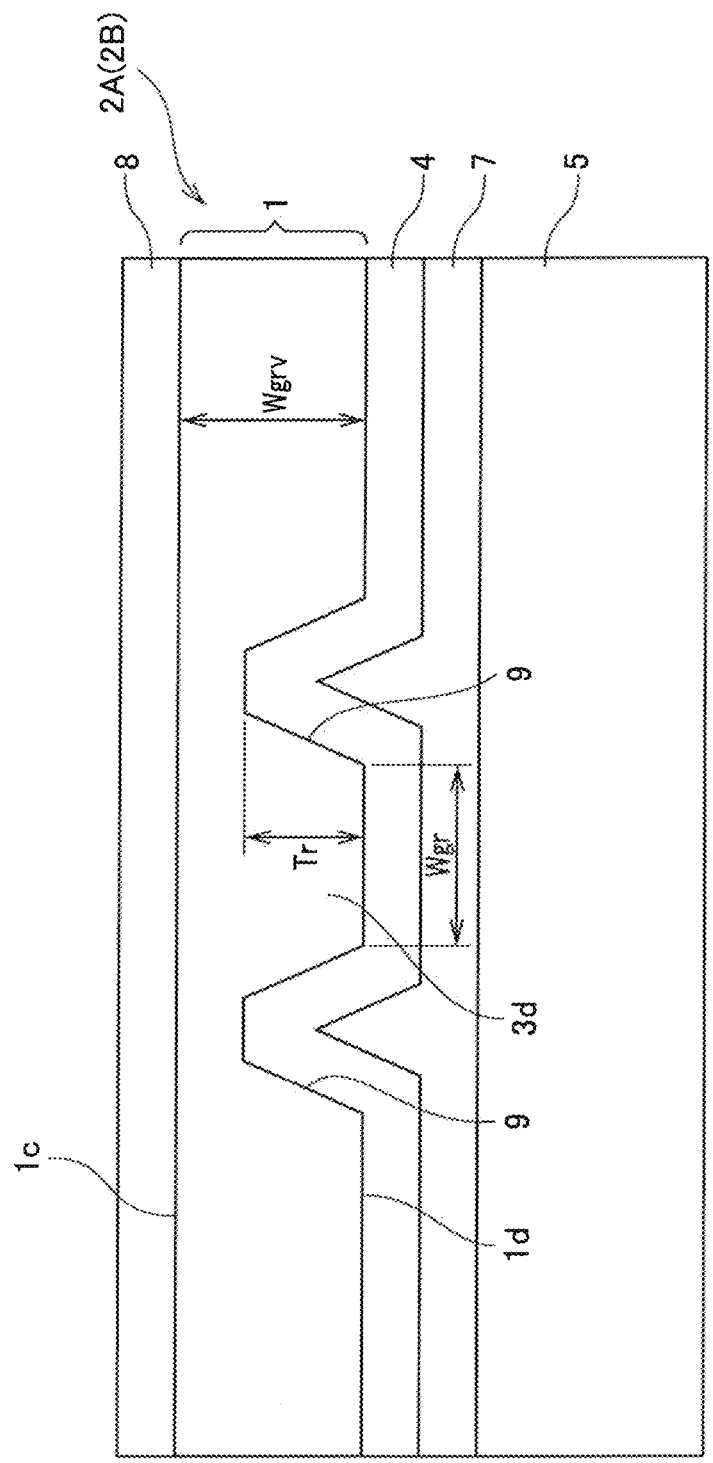

Fig. 14

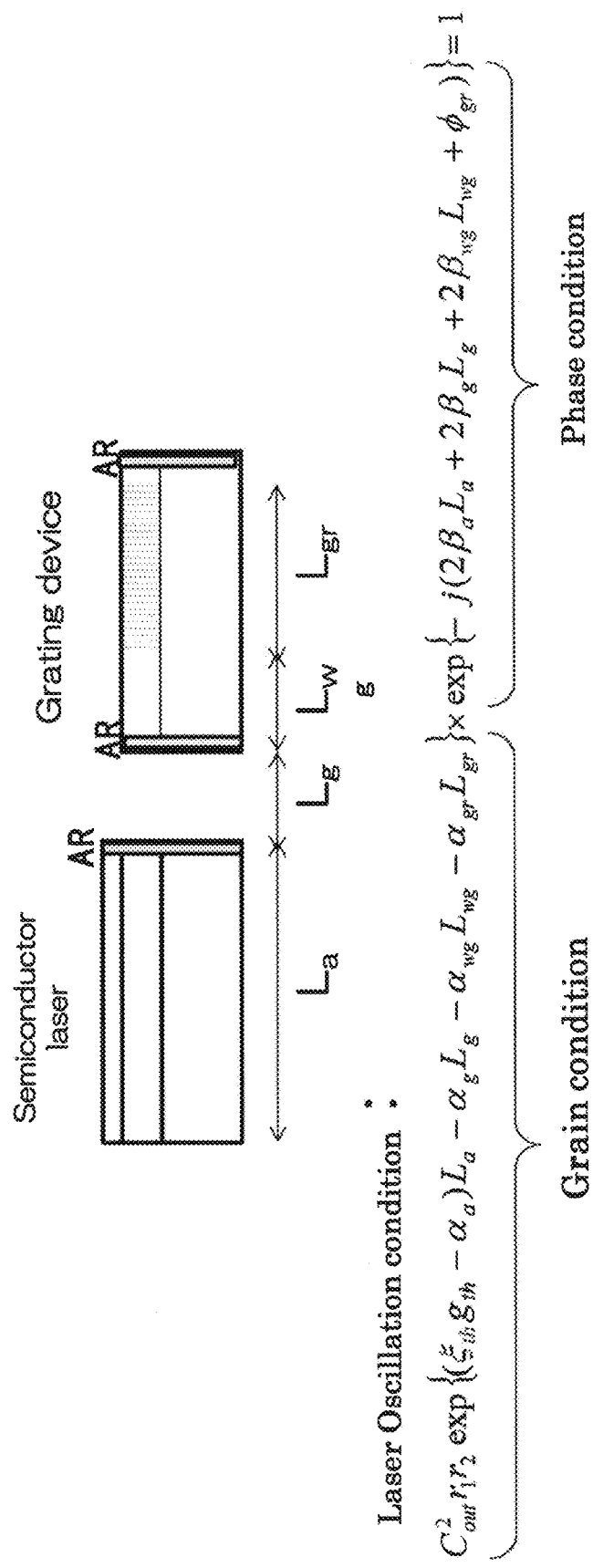

Laser Oscillation condition :

$$C_{out}^2 r_1 r_2 \exp\{(\xi_{th}g_{th}-\alpha_a)L_a - \alpha_g L_g - \alpha_{wg}L_{wg} - \alpha_{gr}L_{gr}\} \times \exp\{-j(2\beta_a L_a + 2\beta_g L_g + 2\beta_{wg}L_{wg} + \phi_{gr})\} = 1$$

Grain condition — Phase condition $$\xi_{th}g_{th} = \alpha_a + \frac{1}{L_a}\left\{\alpha_g L_g + \alpha_{wg}L_{wg} + \alpha_{gr}L_{gr} + \ln\left(\frac{1}{C_{out}^2 r_1 r_2}\right)\right\}$$

$$2\beta_a L_a + 2\beta_g L_g + 2\beta_{wg}L_{wg} + \phi_{gr} = 2\pi m$$

GRATING ELEMENT AND EXTERNAL RESONATOR TYPE LIGHT EMITTING DEVICE

TECHNICAL FIELD

The present invention relates to a grating element and an external resonator type light emitting device using the same.

BACKGROUND ARTS

Semiconductor lasers generally used are of a Fabry-Perot (FP) type that includes an optical resonator sandwiched between mirrors formed at both end faces of an active layer. However, the FP laser oscillates at a wavelength that satisfies the standing-wave condition, and thereby tends to operate in a multi-longitudinal mode. In particular, as current or temperature changes, the lasing wavelength of the laser varies, which results in a change in the optical intensity.

Meanwhile, for the purpose of optical communications, gas sensing, and the like, lasers are required to exhibit high wavelength stability and to oscillate in a single mode. For this reason, a distributed feedback (DFB) laser and a distributed Bragg reflector (DBR) laser have been developed. These lasers are designed to include a diffraction grating formed in a semiconductor and to oscillate at a specific wavelength using the wavelength dependency of the grating.

Examples of semiconductor lasers that achieve adequate wavelength stability can include a DBR laser and a DFB laser, which have a grating monolithically formed in a semiconductor laser, and an external resonator laser having a fiber grating (FBG) grating attached to the outside of the laser. These are based on the principle that part of the laser light is returned to the lasers by mirrors with the wavelength selectivity using Bragg reflection to achieve a stable wavelength operation.

The DBR laser achieves a resonator by forming convex and concave portions in a waveguide surface located on an extended line of a waveguide in an active layer to thereby fabricate mirrors in conformity with Bragg reflection (see Patent Document 1 (Japanese Unexamined Patent Application Publication S49(1974)-128689A); and Patent Document 2 (Japanese Unexamined Patent Application Publication S56(1981)-148880A)). In such a laser, diffraction gratings are provided on both ends of an optical waveguide layer, whereby light emitted from the active layer propagates through the optical waveguide layer, and part of the light is reflected by the diffraction gratings to return to a current injection portion and then to be amplified. The light with only one wavelength is reflected from the diffraction grating in a determined direction, so that the wavelength of the laser light becomes constant.

As a further application of this laser, an external resonator type semiconductor laser has been developed that includes a resonator formed outside a semiconductor by installing a diffraction grating as a component that differs from the semiconductor. This type of laser is a laser having excellent wavelength stability, temperature stability, and controllability. Examples of the external resonator include a fiber Bragg grating (FBG) (Non-Patent Document 1) and a volume hologram grating (VHG) (Non-Patent Document 2). The diffraction grating is configured separately from the semiconductor laser, which has the feature that the reflectance and the length of the resonator can be designed individually. Thus, the diffraction grating is not influenced by increases in temperature due to the heat generated by current injection, so that the wavelength stability can be further improved.

Since the change in the refractive index of the semiconductor depending on the temperature is different from that of the diffraction grating, the diffraction grating can be designed together with the length of the resonator, thereby enhancing the temperature stability of the semiconductor laser.

Patent Document 6 (Japanese Unexamined Patent Application Publication No. 2002-134833A) discloses an external resonator type laser that utilizes a grating formed in a quartz glass waveguide. This document provides the laser with adequate frequency stability that can be used in an environment in which the room temperature changes significantly (e.g. to 30° C. or higher), without a temperature controller. Furthermore, it states that a temperature-independent laser is provided which suppresses mode hopping and has no temperature dependency of its lasing frequency.

RELATED ART DOCUMENTS

Patent Documents

Patent Document 1: Japanese Unexamined Patent Application Publication No. S49(1974)-128689A
Patent Document 2: Japanese Unexamined Patent Application Publication No. S56(1981)-148880A
Patent Document 3: WO2013/034813A
Patent Document 4: Japanese Unexamined Patent Application Publication No. 2000-082864A
Patent Document 5: Japanese Unexamined Patent Application Publication No. 2006-222399A
Patent Document 6: Japanese Unexamined Patent Application Publication No. 2002-134833A
Patent Document 7: Japanese Patent Application No. 2013-120999A

Non-Patent Documents

Non-Patent Document 1: IEICE Transactions on Fundamentals of Electronics, Communications and Computer Sciences, C-II, Vol. J81, No. 7, July, 1998, pp. 664-665
Non-Patent Document 2: IEICE Technical Report LQE, 2005, Vol. 105, No. 52, pp. 17-20
Non-Patent Document 3: Furukawa Review, No. 105, January, 2000, p 24-29

SUMMARY OF THE INVENTION

Non-Patent Document 1 describes the mechanism of mode hopping that impairs wavelength stability due to an increase in temperature, as well as the measures against this mechanism. A change $\delta\lambda_S$ in the wavelength of the external resonator type laser due to the temperature is represented under the standing-wave condition by the following formula.

$$\delta\lambda_s = \lambda_0 \frac{\Delta n_a L_a}{n_f L_f + n_a L_a} \delta T_a + \lambda_0 \frac{\Delta n_f L_f}{n_f L_f + n_a L_a} \delta T_f \qquad \text{[Formula 1]}$$

where $\Delta n_a$ is a change in the refractive index in an active layer region of the semiconductor, $L_a$ is the length of the active layer, $\Delta n_f$ is a change in the refractive index of an FBG region, $L_f$ is the length of the FBG region, and $\delta T_a$ and $\delta T_f$ are changes in the temperatures of the active layer region and the FBG region, respectively.

Here, $\lambda_0$ represents the reflection wavelength of the grating in an initial state.

Furthermore, $\delta\lambda_G$ is a change in the reflection wavelength of the grating and is represented by the following formula.

$$\delta\lambda_G = \lambda_0 \frac{\Delta n_f}{n_f} \delta T_f \quad \text{[Formula 2]}$$

Mode hopping occurs when a longitudinal mode spacing $\Delta\lambda$ of the external resonator is equal to a difference between the wavelength change $\delta\lambda_S$ and the reflection wavelength change $\delta\lambda_G$ of the grating. Thus, the following formula is obtained.

$$\Delta\lambda = \delta\lambda_s = \lambda_0 \frac{\Delta n_f}{n_f} \delta T_f \quad \text{[Formula 3]}$$

The longitudinal mode spacing $\Delta\lambda$ is approximately represented by the following formula.

$$\Delta\lambda = \frac{\lambda_0^2}{2(n_f L_f + n_a L_a)} \quad \text{[Formula 4]}$$

Formula 5 is derived from Formulas 3 and 4.

$$\Delta T_{all} = \frac{\lambda_0}{2 n_a L_a (\Delta n_a / n_a - \Delta n_f / n_f)} \quad \text{[Formula 5]}$$

To suppress mode hopping, the laser needs to be used within a temperature range of $\Delta T_{all}$ or less, and the temperature of the laser is controlled by a Peltier element. In Formula 5, when the change in the refractive index of the active layer is substantially identical to that of the grating layer ($\Delta n_a/n_a = \Delta n_f/n_f$), the denominator becomes zero, leading to an infinite temperature in which mode hopping occurs, showing that no mode hopping would occur. However, in the monolithic DBR laser, current is injected into the active layer for lasing, whereby the active layer and the grating layer cannot have the identical change in the refractive index, causing mode hopping.

Mode hopping is the phenomenon in which the lasing mode (longitudinal mode) in the resonator is shifted from one mode to another. As the temperature or injection current changes, the conditions for the gain and the resonator will vary, which changes the lasing wavelength, causing a problem of fluctuations in optical power that is called kink. Thus, the wavelength of FP GaAs semiconductor lasers normally changes at a temperature coefficient of 0.3 nm/° C., but once mode hopping occurs, the wavelength fluctuates more than this level. Simultaneously, the output from the laser fluctuates by 5% or more.

Thus, to suppress mode hopping, the temperature of the semiconductor laser is controlled by using the Peltier element. However, this increases the number of components, resulting in a larger module and a consequent higher cost.

In the technique described in Patent Document 6, in order not to make a semiconductor laser dependent on temperature, stress is applied to an optical waveguide layer while the conventional resonator structure is maintained, thus compensating for a temperature coefficient due to thermal expansion. In this way, the temperature independency is achieved. Thus, a metal plate is bonded onto the element, and a layer for adjusting the temperature coefficient is added into the waveguide. This causes a problem that the size of the resonator structure is further increased.

The inventors have disclosed an external resonator type laser structure using an optical waveguide grating element in Patent Document 7. In this application, when a full width at half maximum $\Delta\lambda_G$ of the reflection characteristic of the grating element satisfies a specific formula, the laser structure enables lasing that exhibits high wavelength stability while having no power variation without any temperature control.

Here, it is desirable to simultaneously ensure the tolerance of axial misalignment while maintaining the coupling efficiency between a light source and the grating element. Specifically, it is desirable to set the coupling efficiency at 50% or more, and a range of the tolerance of axial misalignment at approximately ±1 µm.

To improve the tolerance of axial misalignment of the coupling efficiency, the inventors have tried to set the thickness of an optical material layer in an incident portion and the width of a ridge optical waveguide larger than a mode-field diameter (in the vertical or horizontal direction) of laser light emitted from the light source. For example, the width of the ridge optical waveguide was 1.5 times or more as large as the mode-field diameter in the horizontal direction of the laser light. Furthermore, the thickness of the optical material layer was 1.5 times or more as large as the mode-field diameter in the vertical direction of the laser light.

In general, the transverse mode of a light source is a single mode, and its spot diameter ranges from 0.5 µm to 2 µm in the vertical direction and from 1 µm to 6 µm in the horizontal direction. For example, the thickness of the optical material layer in the incident portion is set to satisfy $W_{in\nu}/\lambda$ of 2 or more. An too thick optical material layer leads to a significant coupling loss. Thus, $W_{in\nu}/\lambda$ is preferably 3 or less. In particular, the width of the ridge optical waveguide in the incident portion at a wavelength from 0.7 µm to 1.1 µm is preferably 5 µm or more in terms of increasing the tolerance of axial misalignment, and preferably 10 µm or less in terms of preventing significant coupling loss.

However, increasing the width of the ridge optical waveguide to enlarge the tolerance of axial misalignment is found to excite the multi-mode in the Bragg grating, making it less likely to cause the excitation in the single mode. In this case, the emitted light becomes multi-mode light. Furthermore, for the multi-mode light, a plurality of reflection wavelengths is present, making the wavelength of the laser unstable.

Accordingly, it is an object of the present invention to provide an external resonator type laser with a Bragg grating that has improved wavelength stability while increasing the tolerance of axial misalignment between laser light from a light source and an optical waveguide of a grating element.

The present invention provides a grating element comprising:

a support substrate;

an optical material layer disposed over the support substrate;

a ridge optical waveguide disposed in the optical material layer, the ridge optical waveguide having an incidence surface to which a laser light is incident and an emission end from which an emission light with a desired wavelength is emitted; and a Bragg grating comprising concave and convex portions formed within the ridge optical waveguide, wherein the ridge optical waveguide comprises an incident portion disposed between the incidence surface and the Bragg grating, and a tapered portion disposed between the incident portion and the Bragg grating, wherein a propagating light propagates through at least in the Bragg grating in a single mode, wherein a width of the ridge optical waveguide in the incident portion is larger than a width of the ridge optical waveguide in the Bragg grating, wherein a width of the ridge optical waveguide in the tapered portion is decreased from the incident portion toward the Bragg grating, and wherein relationships represented by formulas (1) to (4) below are satisfied:

$$0.8 \text{ nm} \leq \Delta\lambda_G \leq 6.0 \text{ nm} \quad (1)$$

$$10 \text{ μm} \leq L_b \leq 300 \text{ μm} \quad (2)$$

$$20 \text{ nm} \leq t_d \leq 250 \text{ nm} \quad (3)$$

$$n_b \geq 1.8 \quad (4)$$

($\Delta\lambda_G$ in the formula (1) is a full width at half maximum of a peak of a Bragg reflectance in the Bragg grating;

$L_b$ in the formula (2) is a length of the Bragg grating;

$t_d$ in the formula (3) is a depth of each of the concave and convex portions forming the Bragg grating; and $n_b$ in the formula (4) is a refractive index of a material forming the optical material layer.)

Furthermore, the present invention provides a grating element, comprising:

a support substrate;

an optical material layer disposed over the support substrate;

a ridge optical waveguide disposed in the optical material layer, the ridge optical waveguide having an incidence surface on which a laser light is incident and an emission end from which an emission light with a desired wavelength is emitted; and a Bragg grating including concave and convex portions formed within the ridge optical waveguide, wherein the ridge optical waveguide includes an incident portion disposed between the incidence surface and the Bragg grating, and a tapered portion disposed between the incident portion and the Bragg grating, wherein a propagation light propagates at least in the Bragg grating in a single mode, wherein a width of the ridge optical waveguide in the incident portion is larger than a width of the ridge optical waveguide in the Bragg grating, wherein a width of the ridge optical waveguide in the tapered portion is decreased from the incident portion toward the Bragg grating, wherein relationships represented by formulas (1) to (3) below are satisfied, and wherein a material forming the optical material layer is selected from the group consisting of gallium arsenide, lithium niobate single crystal, tantalum oxide, zinc oxide, aluminum oxide, lithium tantalate, magnesium oxide, niobium oxide, and titanium oxide, $$0.8 \text{ nm} \leq \Delta\lambda_G \leq 6.0 \text{ nm} \quad (1)$$

$$10 \text{ μm} \leq L_b \leq 300 \text{ μm} \quad (2)$$

$$20 \text{ nm} \leq t_d \leq 250 \text{ nm} \quad (3)$$

(where $\Delta\lambda_G$ in the formula (1) is a full width at half maximum of a peak of a Bragg reflectance in the Bragg grating;

$L_b$ in the formula (2) is a length of the Bragg grating; and $t_d$ in the formula (3) is a depth of each of the concave and convex portions forming the Bragg grating.)

Moreover, the present invention provides an external resonator type light emitting device that includes a light source adapted to oscillate a semiconductor laser light and a grating element forming an external resonator together with the light source, wherein the light source includes an active layer for oscillating the semiconductor laser light, and the grating element is one described above.

In general, when using a fiber grating, quartz has such a small temperature coefficient of the refractive index that $d\lambda_G/dT$ becomes small while $|d\lambda_G/dT - d\lambda_{TM}/dT|$ becomes large. Thus, the temperature range $\Delta T$ in which mode hopping occurs tends to be narrower.

For this reason, the refractive index of a waveguide substrate with the grating formed therein is preferably increased. With this arrangement, the temperature coefficient of the refractive index can be increased to make the $d\lambda_G/dT$ larger and $|d\lambda_G/dT - d\lambda_{TM}/dT|$ smaller, and thus the temperature range $\Delta T$ in which mode hopping occurs can be wider.

In the present invention, contrary to the common general knowledge of a person skilled in the art, a full width at half maximum $\Delta\lambda_G$ at the peak of the Bragg reflectance is set larger. Additionally, to suppress the occurrence of mode hopping, a spacing between wavelengths satisfying a phase condition (longitudinal mode spacing) needs to be larger. Thus, it is necessary to shorten the length of the resonator, whereby the length $L_b$ of the grating element is decreased to 300 μm or less.

Moreover, the depth $t_d$ of each of concave and convex portions forming the Bragg grating is adjusted to be not less than 20 nm nor more than 250 nm, whereby $\Delta\lambda_G$ can be set at not less than 0.8 nm nor more than 6 nm, and the number of the longitudinal modes within the range $\Delta\lambda_G$ can be adjusted to be in a range of 2 to 5. That is, the wavelengths satisfying the phase condition are discrete. When the number of the longitudinal modes within the range $\Delta\lambda_G$ is not less than 2 nor more than 5, mode hopping repeatedly occurs within the range $\Delta\lambda_G$ and does not deviate therefrom. As a consequence, it is found that no significant mode hopping occurs, so that the wavelength stability can be enhanced to suppress fluctuations in the optical power.

Additionally, the width of the ridge optical waveguide in the incident portion is set larger than the mode-field diameter in the horizontal direction of the laser light, for example, at 1.5 times or more as large as the mode-field diameter, thus making it possible to increase the tolerance of axial misalignment from the light source. It should be noted that the optical waveguide with the large width might generate multi-mode propagation light in the Bragg grating, thus degrading the wavelength stability. Thus, in the present invention, the width of the ridge optical waveguide in the Bragg grating is set relatively small, and a tapered portion that decreases the width of the ridge optical waveguide is provided between the incident portion and the Bragg grating. This arrangement successfully improves the tolerance of axial misalignment under a condition in which the propagation light becomes the single mode in the Bragg grating.

BRIEF DESCRIPTION OF THE DRAWINGS

FIG. 4 is a perspective view of the grating element.

FIG. 5 is a cross-sectional view of the grating element.

FIG. 6 is a cross-sectional view of another grating element.

FIG. 7 is a cross-sectional view of a further grating element.

FIG. 14 is a diagram for explaining lasing conditions.

DESCRIPTION OF EMBODIMENTS

Figure 1A:
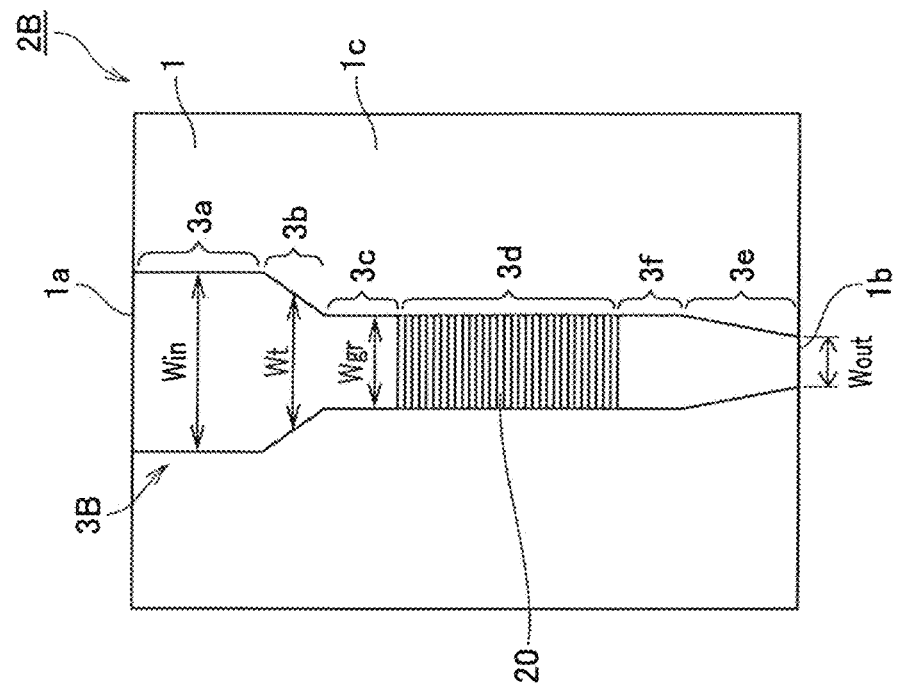
FIGS. 1(a) and 1(b) are schematic plan views showing grating elements 2A and 2B, respectively.
Figure 1B:
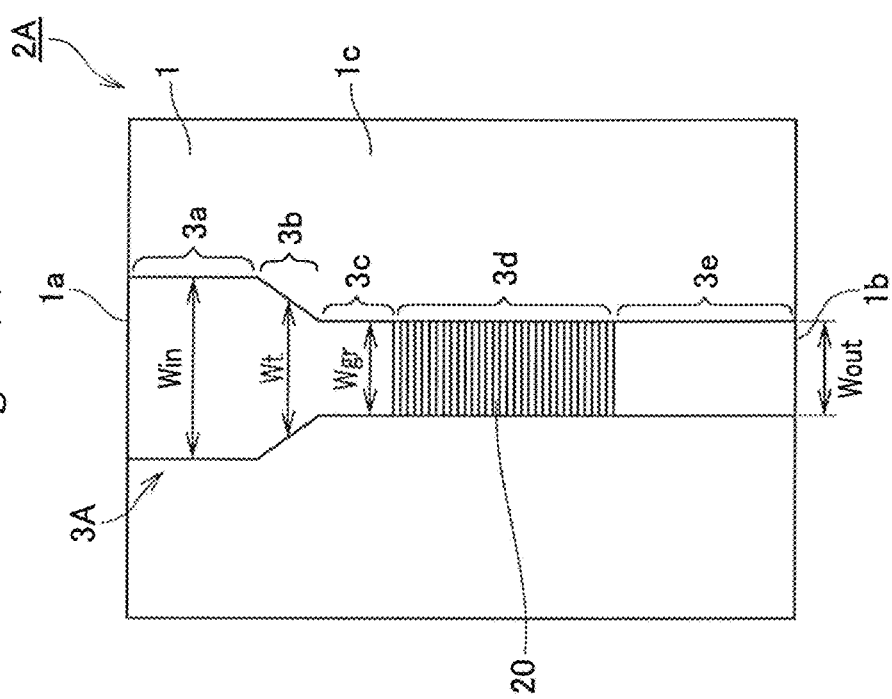

As shown in FIGS. 1(a) and 1(b), each of grating elements 2A and 2B includes an optical material layer 1 that has an incidence surface 1a on which a laser light is incident and an emission surface 1b from which a light with a desired wavelength emits. A ridge optical waveguide 3A is provided within the optical material layer 1, and a ridge optical waveguide 3B is provided within the optical material layer 1.

The ridge optical waveguide 3A includes an incident portion 3a, a tapered portion 3b, a coupling portion 3c, a grating portion 3d, and an emission portion 3e. The grating portion 3d has a Bragg grating 20 formed therein. The width of the emission portion 3e is set constant. The ridge optical waveguide 3B includes the incident portion 3a, the tapered portion 3b, the coupling portion 3c, the grating portion 3d, the emission portion 3e, and a coupling portion 3f located between the grating portion and the emission portion 3e. The grating portion 3d has the Bragg grating 20 formed therein. While the width of the coupling portion 3f is set constant, the width of the emission portion 3e is gradually decreased as it approaches the emission surface.

Figure 2A:
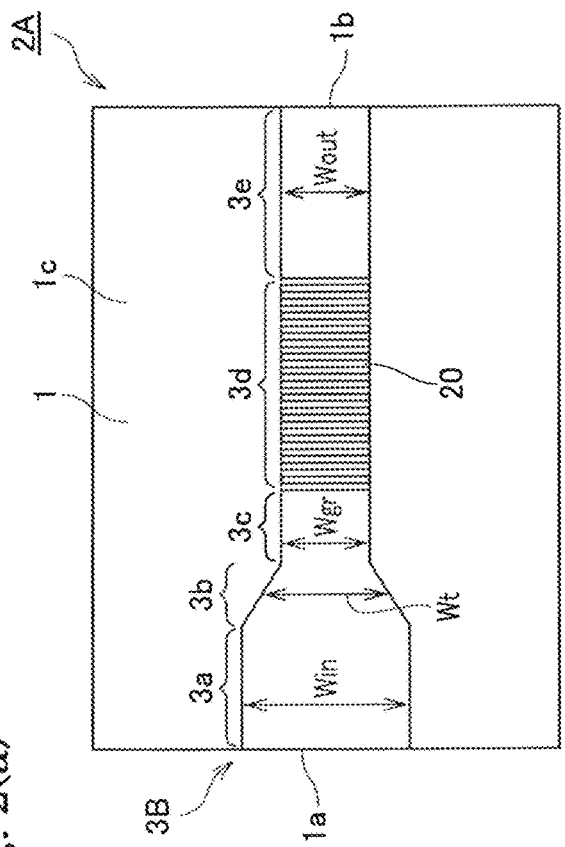
FIG. 2 (a) is a schematic plan view showing the grating element 2A.
FIG. 2(b) is a schematic side view of the grating element 2A.
Figure 2B:
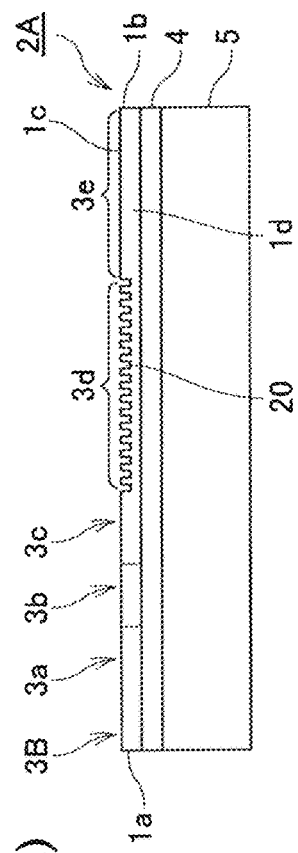

As illustrated in FIGS. 2(a) and 2(b), for the grating element 2A, the optical material layer 1 is formed over a support substrate 5 with a lower cladding layer 4 interposed between them. The optical material layer 1 has an upper surface 1c. The cladding layer may be made of any material that has a smaller refractive index than the optical material layer and thus may be an adhesive layer. When the cladding layer is made of the adhesive layer, a bottom surface 1d of the optical material layer is bonded onto the support substrate 5.

Figure 3A:
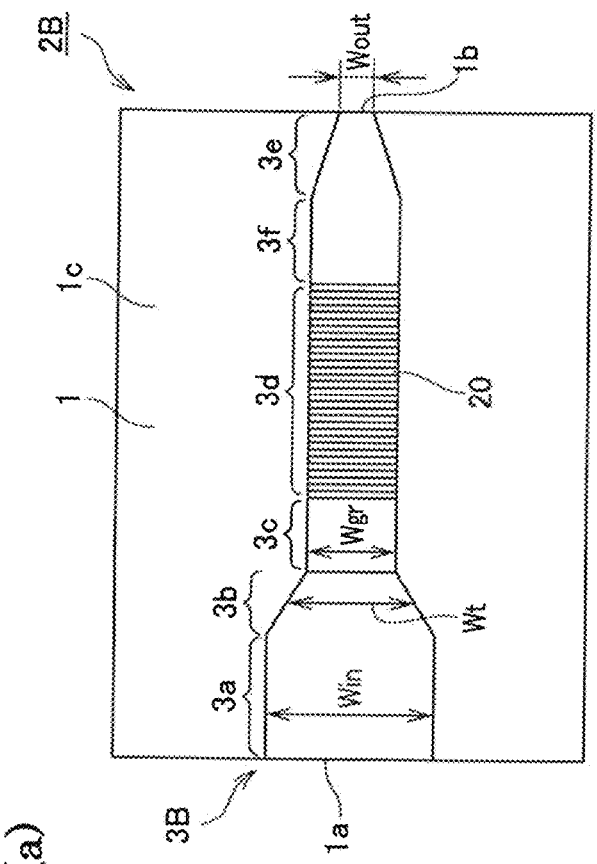
FIG. 3 (a) is a schematic plan view showing the grating element 2B.
FIG. 3(b) is a schematic side view of the grating element 2B.
Figure 3B:
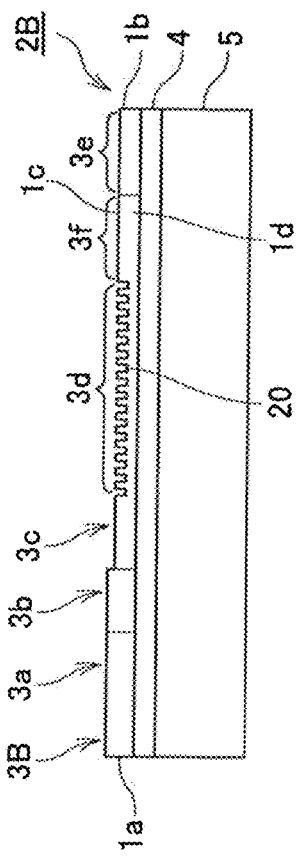

As illustrated in FIGS. 3(a) and 3(b), for the grating element 2B, the optical material layer 1 is formed over the support substrate 5 with the lower cladding layer 4 interposed between them. The optical material layer 1 has the upper surface 1c. The lower cladding layer may be made of any material that has a smaller refractive index than the optical material layer and thus may be an adhesive layer. When the cladding layer is made of the adhesive layer, the bottom surface 1d of the optical material layer is bonded to the support substrate 5.

FIG. 4 schematically illustrates a perspective view of the grating element 2A. The same goes for the grating element 4B.

FIGS. 5, 6, and 7 respectively illustrate cross-sectional views of the grating elements taken along the Bragg gratings.

In an example illustrated in FIG. 5, the optical material layer 1 is formed over the support substrate 5 with an adhesive layer 7 and the lower buffer layer 4 interposed between them, and an upper buffer layer 8 is formed over the optical material layer 1. For example, a pair of ridge grooves 9 is formed in the optical material layer 1, and the grating portion 3d of the ridge optical waveguide is formed between the adjacent ridge grooves 9.

In this case, the Bragg grating may be formed on the upper surface 1c side or on the bottom surface 1d side. To reduce variations in the shapes of the Bragg grating and the ridge groove, the Bragg grating is preferably formed on the flat bottom surface 1d side, thereby positioning the ridge grooves 9 on the opposite side of the substrate from the Bragg grating.

The example shown in FIG. 6 is substantially the same as the example shown in FIG. 5. Note that the optical material layer 1 is formed over the support substrate 5 with the lower buffer layer 4 interposed between them. The upper buffer layer 8 is formed on the optical material layer 1.

In an example shown in FIG. 7, the optical material layer 1 is formed over the support substrate 5 via the adhesive layer 7 and the lower buffer layer 4, and the upper buffer layer 8 is formed on the optical material layer 1. For example, a pair of ridge grooves 9 is formed on the support substrate 5 side of the optical material layer 1, and the ridge optical waveguide 3d is formed between the adjacent ridge grooves 9. In this case, the Bragg grating may be formed on the flat upper surface 1c side or at the bottom surface 1d side with the ridge grooves formed thereat. To reduce variations in the shapes of the Bragg grating and the ridge groove, the Bragg grating is preferably formed on the flat upper surface 1c side, thereby positioning the ridge grooves on the opposite side of the substrate from the Bragg grating. Further, the upper buffer layer 8 may not be formed. In this case, an air layer can be in direct contact with the grating. With this arrangement, the presence and absence of the grating grooves can increase a difference in the refractive index, so that the reflectance can be increased in a short grating length.

However, when the refractive index of the support substrate 5 is higher than the refractive index of the optical material layer 1, the upper buffer layer is preferably formed in terms of reducing the propagation loss of the light in the waveguide.

Figure 8:
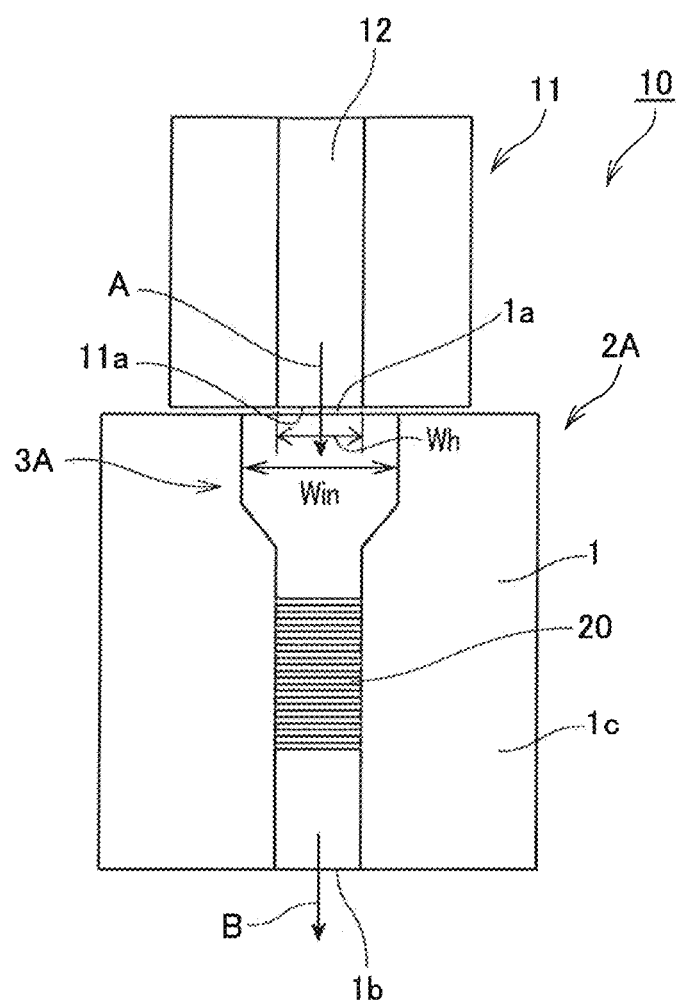
FIG. 8 is a schematic plan view showing an external resonator type light emitting device.
Figure 9:
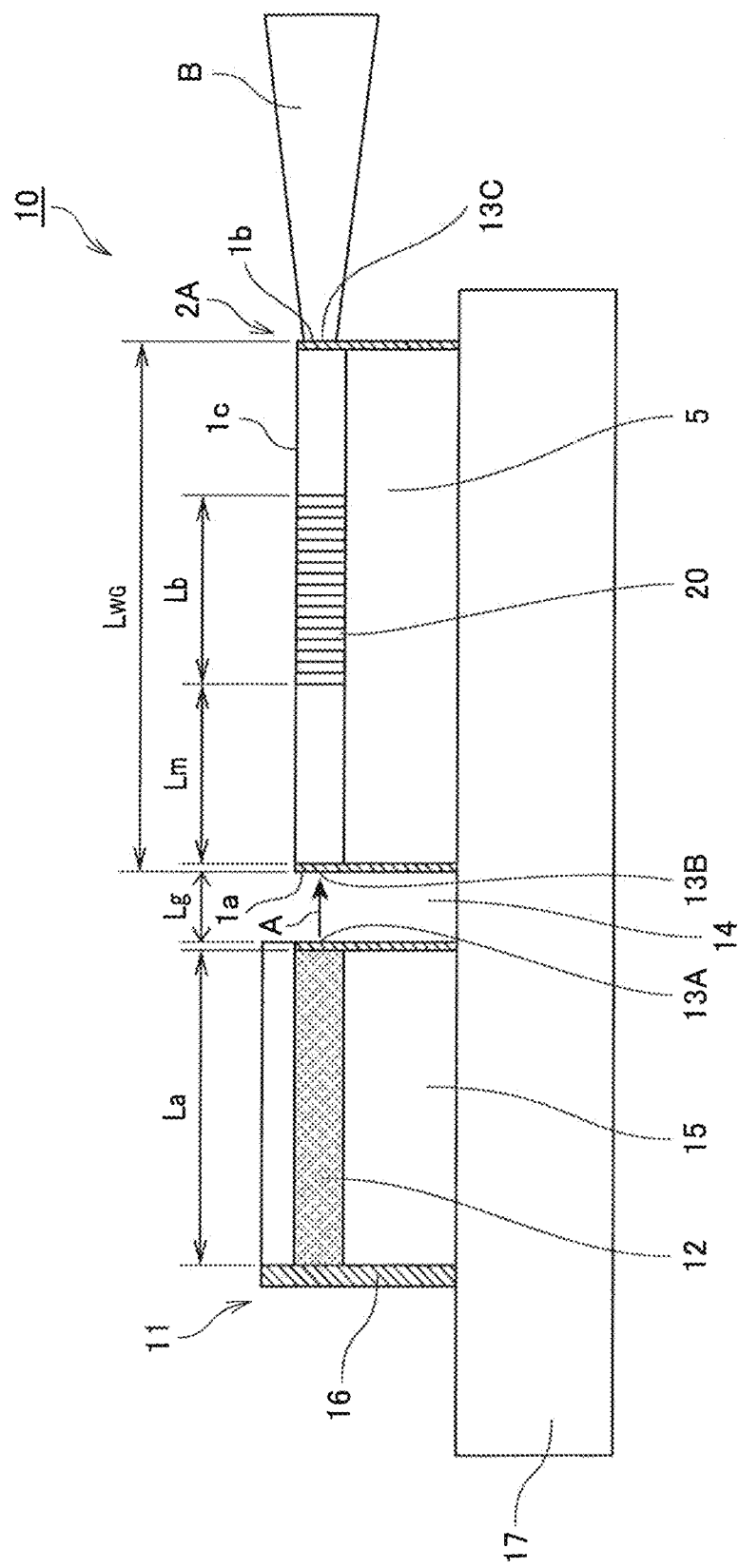
FIG. 9 is a schematic side view showing the external resonator type light emitting device.

A light emitting device 10 as schematically shown in FIGS. 8 and 9 includes a light source 11 that oscillates the laser light, and the grating element 2A. The light source 11 and the grating element 2A are mounted on a common substrate 17.

The light source 11 includes an active layer 12 that oscillates the semiconductor laser light. In this embodiment, the active layer 12 is provided on a base substrate 15. A reflective film 16 is provided at the outer end face of the light source, while an anti-reflective layer 13A is formed at the end face of the active layer 12 on the grating element side.

The incident portion of the grating element faces the active layer 12 with a gap 14 interposed between them. An anti-reflective film 13B is provided on the incidence surface side of the optical material layer 1, while an anti-reflective film 13C is provided on the emission surface side of the optical material layer 1.

The anti-reflective layers 13A, 13B, and 13C need only to have a reflectance lower than the reflectance of the grating, and more preferably have a reflectance of 0.1% or less. However, if the reflectance of the end face of the optical material layer is lower than the reflectance of the grating, the anti-reflective layer may not be required, and a reflective film can also be provided in place of the anti-reflective layer.

In this case, the lasing wavelength of the laser light is determined by the wavelength of light reflected by the Bragg grating. When the light reflected by the Bragg grating and the light reflected from the end face of the active layer on the grating element side exceed a gain threshold of the laser, the oscillation conditions are satisfied. In this way, the laser light with higher wavelength stability can be obtained.

To enhance the wavelength stability, the amount of feedback from the grating needs only to be increased. From this point of view, the reflectance of the grating is preferably set higher than the reflectance of the end face of the active layer.

As a light source, a GaAs-based or InP-based laser with high reliability is suitable for use. In an application of the structure in the present application, for example, when intended to oscillate green laser light as a second harmonic wave using a non-liner optical element, the GaAs-based laser is used that oscillates at a wavelength of around 1064 nm. The GaAs-based or InP-based laser has high reliability, and thus light sources, including a laser array formed by arranging such lasers in one dimension, can be implemented. The laser may be a superluminescent diode or a semiconductor optical amplifier (SOA).

As the wavelength of the laser light becomes longer, changes in the Bragg wavelength depending on the temperature become significant. To enhance the wavelength stability, particularly, the lasing wavelength of the laser is preferably 990 nm or less. On the other hand, as the wavelength of the laser light becomes short, changes in the refractive index Ana of the semiconductor become too significant. To enhance the wavelength stability, particularly, the lasing wavelength of the laser is preferably 780 nm or more. Material of the active layer and the wavelength of light for the active layer can be selected as appropriate.

Note that a method for stabilizing power by a combination of a semiconductor laser and a grating element is disclosed in the following document.

(Non-Patent Document 3: Furukawa Review, No. 105, January, 2000, p 24-29)

The ridge optical waveguide can be obtained by physically processing and forming, for example, by a cutting process with a peripheral cutting edge, or a laser ablation process.

The Bragg grating can be formed by physical or chemical etching in the following way.

Specifically, a metal film made of Ni, Ti, Cr, etc. is deposited on a substrate with a high refractive index, and windows are formed periodically by photolithography, thereby forming an etching mask. Then, periodic grating grooves are formed by a dry etching device for reactive ion etching and the like. Finally, the metal mask is removed, whereby the Bragg grating can be formed.

The ridge optical waveguide can also be formed in the same way as the grating grooves.

To further improve the optical damage resistance of the optical wave guide, the optical material layer may contain one or more kinds of metal elements selected from the group consisting of magnesium (Mg), zinc (Zn), scandium (Sc), and indium (In). In this case, magnesium is particularly preferable. Crystals of the optical material layer can contain a rare-earth element as a doping component. Suitable rare-earth elements particularly include Nd, Er, Tm, Ho, Dy, and Pr.

Material for the adhesive layer may be an inorganic adhesive, an organic adhesive, or a combination of the inorganic adhesive and the organic adhesive.

The optical material layer may be deposited and formed over the support base by a thin-film formation method. Suitable thin-film formation methods can include sputtering, vapor deposition, and CVD. In this case, the optical material layer is formed directly on the support base. Alternatively, after forming a lower buffer layer on the support base, the optical material layer can be formed thereon.

Examples of material for such a support base are not particularly limited to, but including lithium niobate, lithium tantalate, glass, such as fused quartz, crystal, Si, etc.

When the refractive index of the support base is higher than the refractive index of the optical material layer, a lower cladding layer is essential, but additionally an upper cladding layer is preferably provided in terms of reducing the light loss in the waveguide.

The lower and upper cladding layers may be lower and upper buffer layers, respectively, and they have lower refractive index than the optical material layer.

The reflectance of the anti-reflective layer needs to be lower than the grating reflectance. Materials suitable for use in deposition of the anti-reflective layer can include a laminated film made of oxides, such as silicon dioxide, tantalum pentoxide, or oxide of magnesium fluoride, and metals.

The respective end faces of the light-source element and the grating element may be obliquely cut to suppress the end face reflection. Bonding between the grating element and the support substrate is fixed with the adhesive in the example shown in FIG. 2, but may be direct bonding.

In a preferred embodiment, a single-layer film is formed on at least one of the incidence surface and emission surface, the single-layer film having a lower refractive index than the refractive index of material forming the optical material layer. The thickness of such a single-layer film is not necessarily determined strictly, unlike an AR coat. The mere formation of the single-layer film can reduce the end face reflection. Here, if the film is made of a multi-layer, the reduction of the reflection is degraded or eliminated depending on the relationship of the refractive index and thickness between layers of the multi-layer film, which requires the control of the thickness of each layer in the multi-layer film. Thus, the single-layer film is superior. Because of this, the reflectance of the end face of the grating element can be surely reduced, compared to the reflectance of a grating element without the single-layer film. The thickness of the single-layer film is preferably 1 µm or less.

Figure 10:
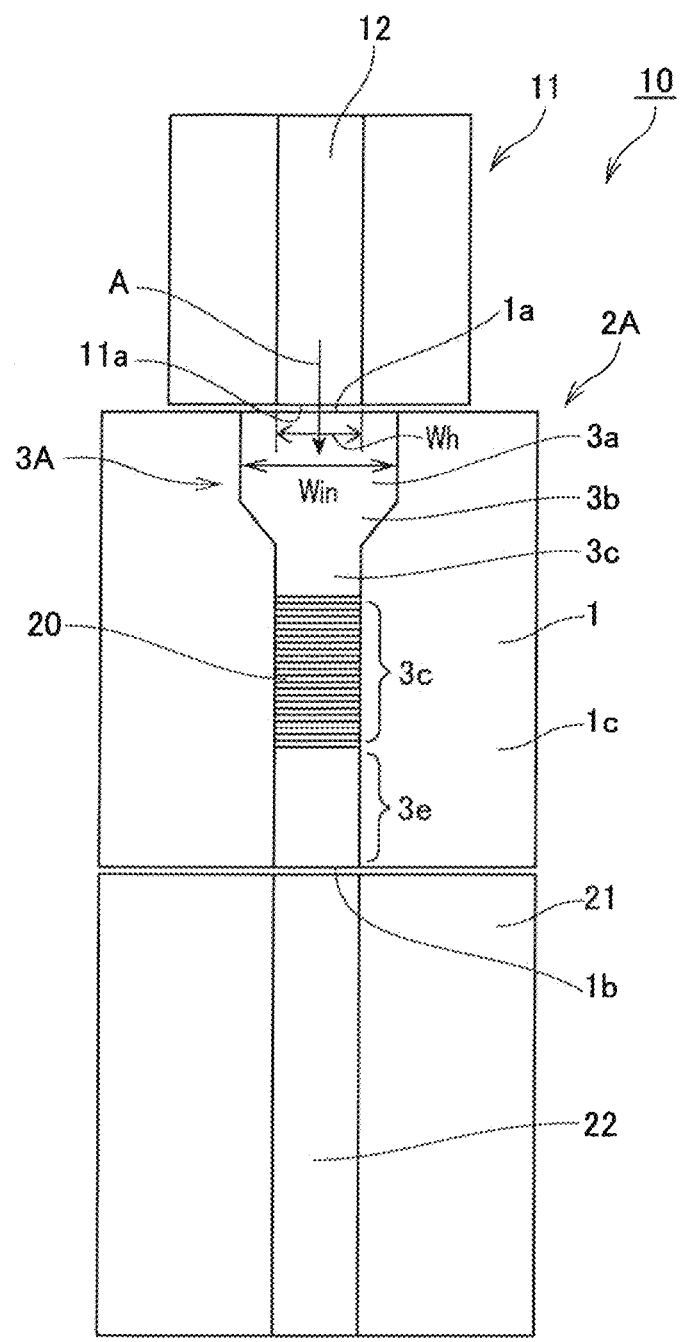
FIG. 10 is a schematic plan view showing another external resonator type light emitting device.

In an example shown in FIG. 10, the grating element 2A is optically coupled to the light source 11, while an optical waveguide 22 of another optical waveguide substrate 21 is optically coupled to the emission surface of the emission portion 3e of the grating element 2A.

Figure 11:
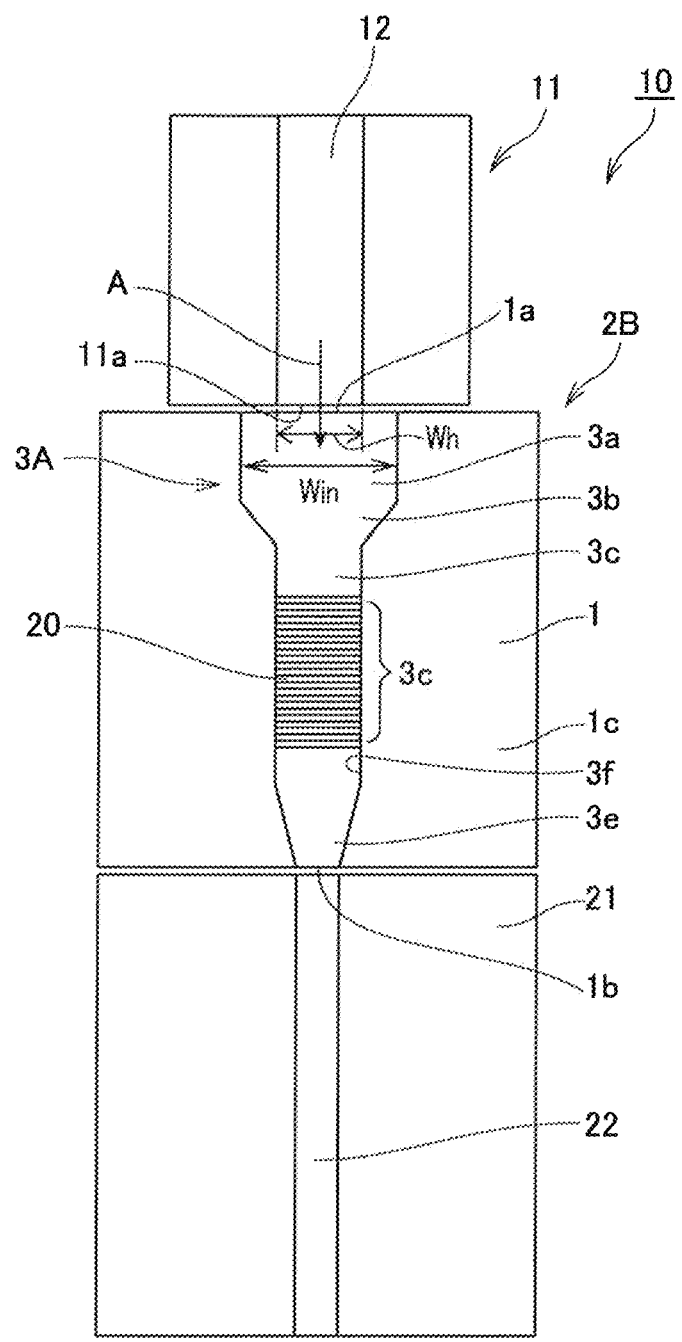
FIG. 11 is a schematic plan view showing a further external resonator type light emitting device.

In an example shown in FIG. 11, the grating element 2B is optically coupled to the light source 11, while the optical waveguide 22 of another optical waveguide substrate 21 is optically coupled to the emission surface of the emission portion 3e of the grating element 2B.

Figure 12:
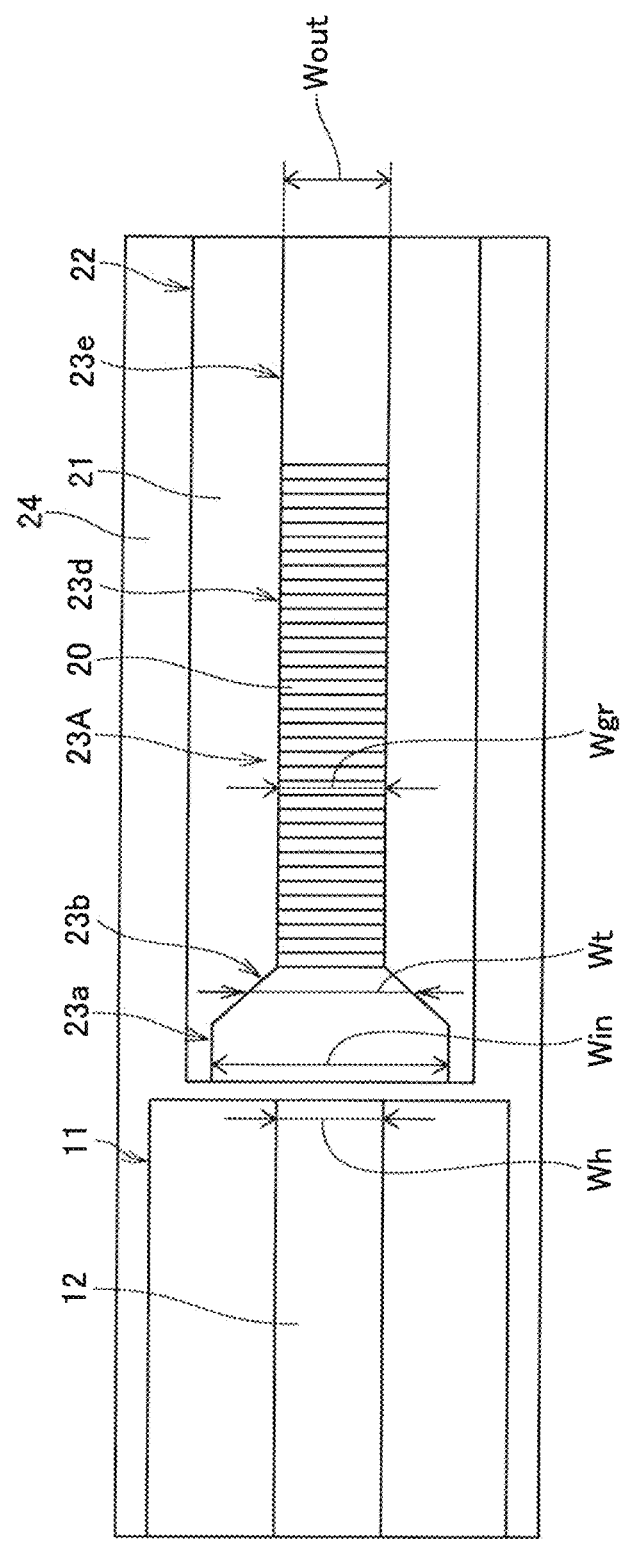
FIG. 12 is a schematic plan view showing an external resonator type light emitting device according to a further embodiment.
Figure 13:
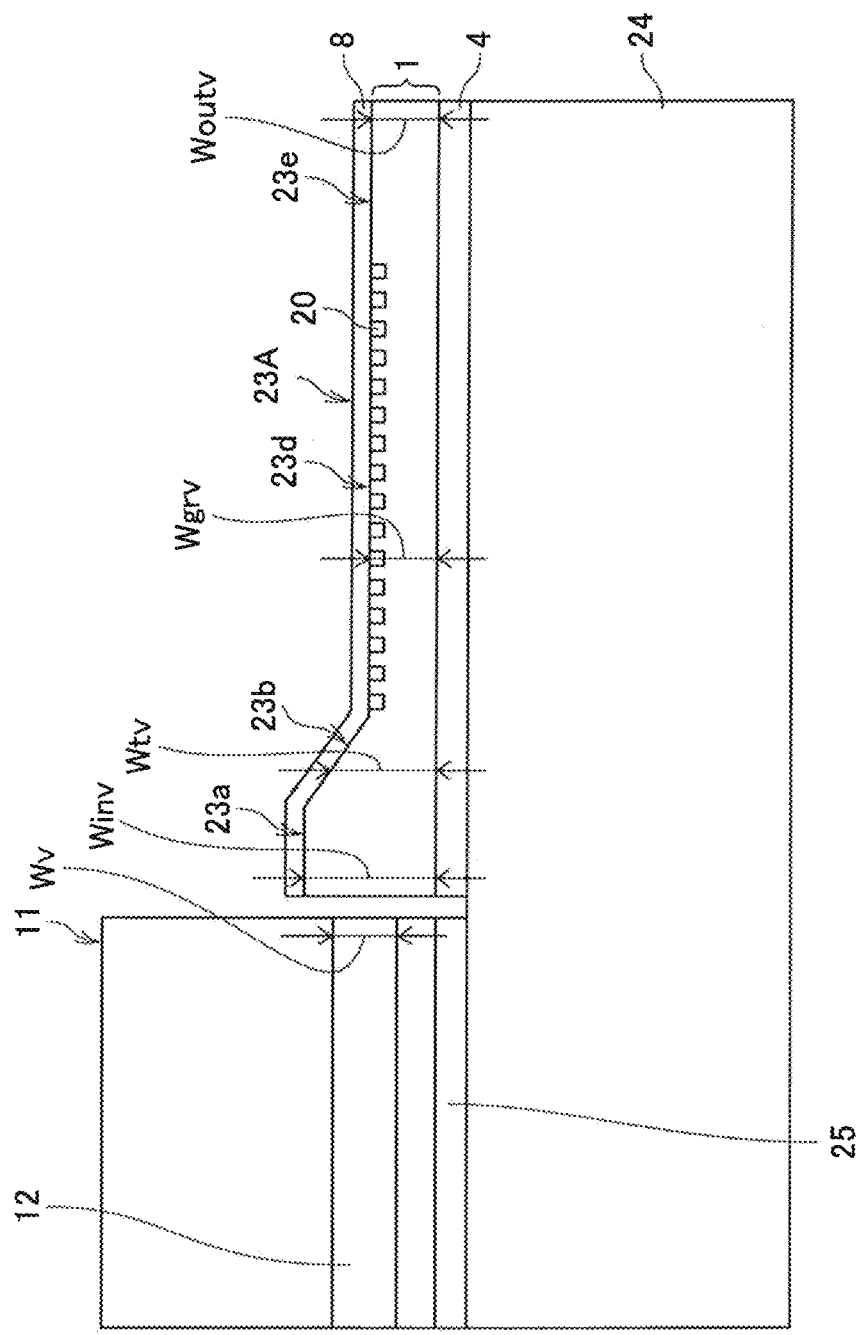
FIG. 13 is a schematic longitudinal sectional view of the external resonator type light emitting device shown in FIG. 12.

In examples shown in FIGS. 12 and 13, the light source 11 and the grating element 22 are mounted on a common substrate 24. Adhesive layers 7 and 25 can also be provided.

The ridge optical waveguide 23A of the grating element 22 includes an incident portion 23a, a tapered portion 23b, a grating portion 23d, and an emission portion 23e. The grating portion 23d has the Bragg grating 20 formed therein. As viewed from the top side of the element (see FIG. 12), an optical waveguide width $W_{in}$ in the incident portion 23a is larger than an optical waveguide width $W_{gr}$ in the Bragg grating. An optical waveguide width $W_t$ in the tapered portion 23b is monotonically decreased from $W_{in}$ toward $W_{gr}$. In this example, an optical waveguide width $W_{out}$ in the emission portion 23e is set constant.

As viewed from the lateral side of the element (see FIG. 13), an optical material layer thickness $W_{inv}$ in the incident portion 23a is set larger than an optical material layer thickness $W_{grv}$ in the Bragg grating. An optical material layer thickness $W_{tv}$ in the tapered portion 23b is monotonically decreased from $W_{inv}$ toward $W_{grv}$. In this example, an optical material layer thickness $W_{outv}$ in the emission portion 23e is set constant.

Now, the conditions of the present invention will be further described with reference to the configuration illustrated in FIG. 14.

It is noted that since mathematical formulas are hard to understand because of the abstractness, first, the direct comparison between a typical form in the related art and one embodiment of the present invention will be made and thereby the features of the present invention will be described. Then, various conditions of the present invention will be described.

First, the lasing condition of the semiconductor laser is determined by the product of the gain condition and the phase condition, given by the following formula.

[Formula 6]

$$(C_{out}^2)^4 |r_1||r_2| \exp\{(\zeta_t g_{th} - \alpha_a) L_a - \alpha_b L_b\} \times \exp\{j(-\phi_1 - \phi_2 - 2\beta L_a)\} = 1 \qquad \text{Formula (2-1)}$$

The gain condition is represented by the following formula derived from Formula (2-1).

$$\zeta_t g_{th} = \alpha_a L_a + \alpha_b L_b + \frac{1}{L_a} \ln\left(\frac{1}{|r_1||r_2|C_{out}^2}\right) \qquad \text{Formula (2-2)}$$

Note that in the formulas, $\alpha_a$, $\alpha_g$, $\alpha_{wg}$, and $\alpha_{gr}$ are loss coefficients in the active layer, the gap between the semiconductor laser and the waveguide, the waveguide portion on the input side without any grating, and the grating portion, respectively; $L_a$, $L_g$, $L_{wg}$, and $L_{gr}$ are the lengths of the active layer, the gap between the semiconductor laser and the waveguide, the waveguide portion on the input side without any grating, and the grating portion, respectively; $r_1$ and $r_2$ are mirror reflectances (where $r_2$ is the reflectance of the grating); $C_{out}$ is a coupling loss between the grating element and the light source; $\xi_t g_{th}$ is a gain threshold of the laser medium; $\phi_1$ is a phase change of a reflective mirror on the laser side; and $\phi_2$ is a phase change on the grating portion.

Formula (2-2) shows that when the gain $\xi_t g_{th}$ of the laser medium (gain threshold) exceeds the loss therein, the lasing is performed. A gain curve (wavelength dependency) of the laser medium has a full width at half maximum of 50 nm or more and exhibits the broad characteristics. The loss terms (on the right side), except for the reflectance of the grating, hardly have the wavelength dependency, so that the gain condition is determined dominantly by the grating. Because of this, in a comparison table, the gain condition can be considered only by the grating.

On the other hand, the phase condition is defined by the following formula derived from Formula (2-1). Note that $\Phi_1$ is zero.

$$\phi_2 + 2\beta_a L_a + 2\beta_g L_g + 2\beta_{wg} L_{wg} = 2p\pi (p \text{ is an integer number.}) \qquad \text{Formula (2-3)}$$

Figure 15:
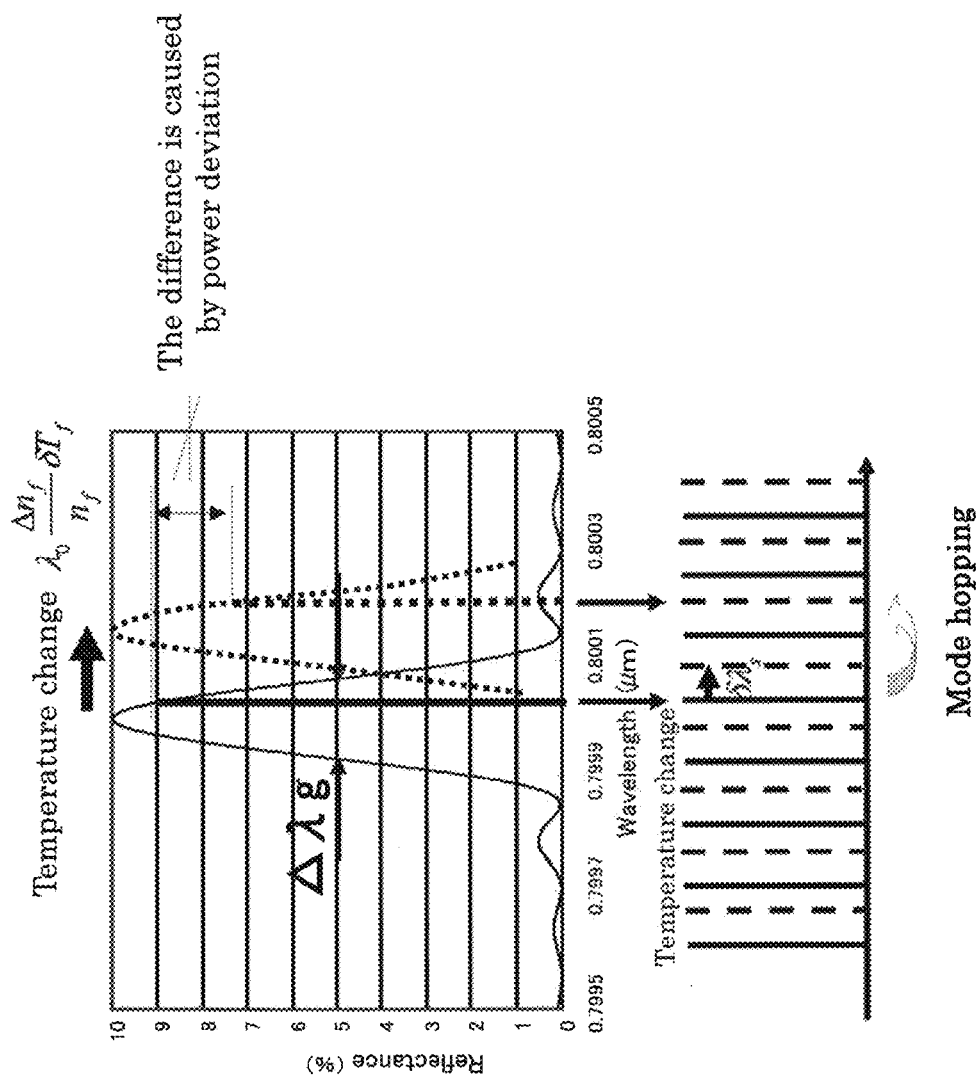
FIG. 15 is a diagram for explaining the form of mode hopping in a conventional example.
Figure 16:
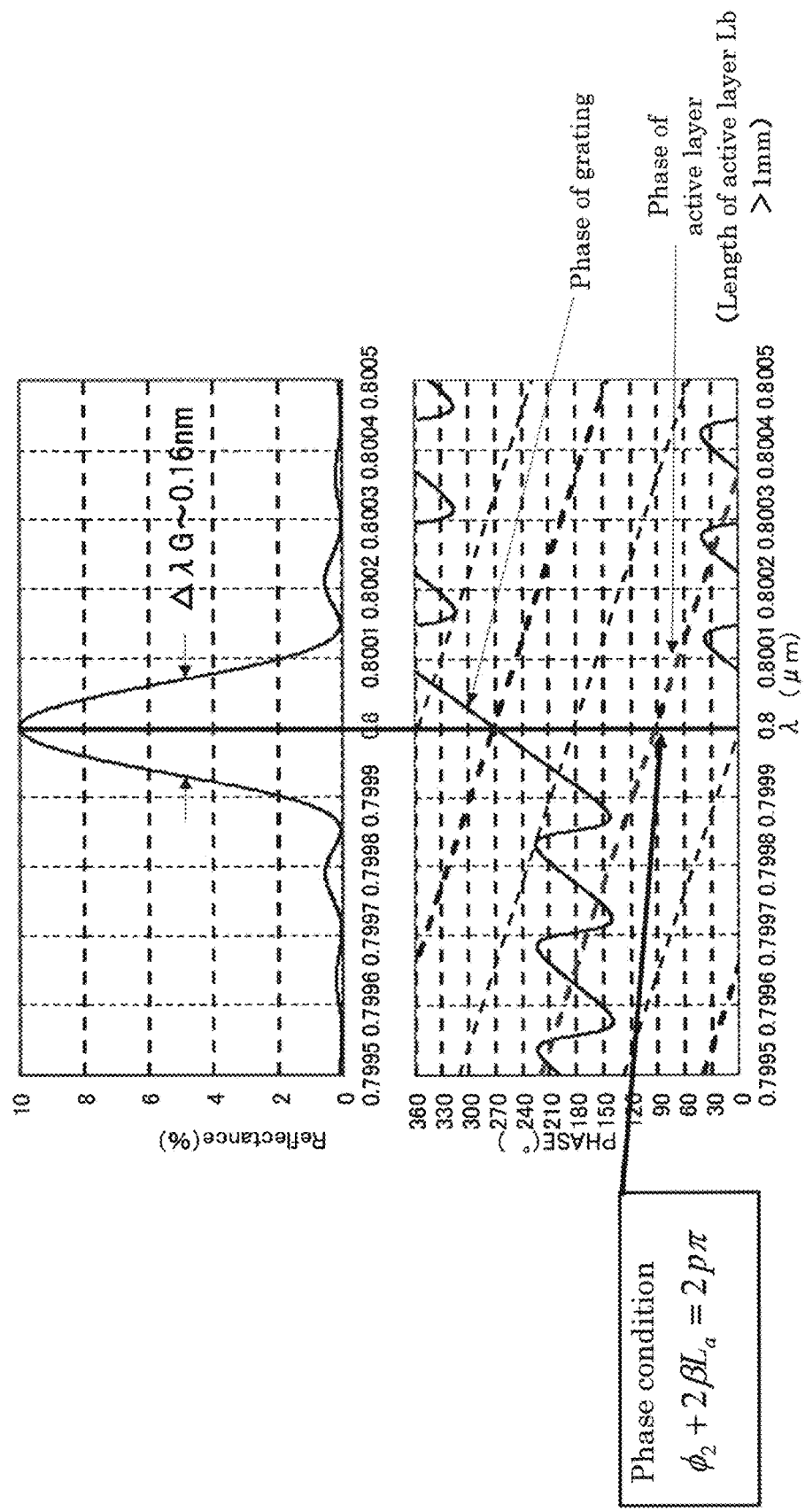
FIG. 16 is another diagram for explaining the form of the mode hopping in the conventional example.

The external-cavity laser, which includes an external resonator that utilizes a quartz-based glass wave guide and an FBG, has been manufactured. As shown in FIGS. 15 and 16, the conventional design concept is that the reflection characteristics of the grating are set to satisfy $\Delta\lambda_G$=approximately 0.2 nm and a reflectance of 10%. This leads to the fact that the length of the grating portion is 1 mm. On the other hand, the phase condition is designed such that the satisfactory wavelengths become discrete, and that the number of wavelengths satisfying Formula (2-3) is set at two or three within $\Delta\lambda_G$. For this reason, the active layer in the laser medium is required to have a greater length. The active layer with a length of 1 mm or more is used.

For the glass waveguide or FBG, the temperature dependency of the wavelength $\lambda_G$ is very small, and $d\lambda_G/dT$ is approximately 0.01 nm/° C. ($d\lambda_G/dT$=approximately 0.01 nm/° C.). This shows that the external resonator type laser has the feature of having high wavelength stability.

However, compared to this case, the temperature dependency of the wavelength satisfying the phase condition is large, and $d\lambda_S/dT$ is approximately 0.05 nm/° C. ($d\lambda_S/dT$=approximately 0.05 nm/° C.), whereby a difference between them is 0.04 nm/° C.

In general, the temperature $T_{mh}$ at which mode hopping occurs can be considered to be represented by the following formula based on Non-Patent Document 1 (where $T_a$ is supposed to be $T_f$ (i.e. $T_a = T_f$)).

$\Delta G_{TM}$ is a spacing between the wavelengths (longitudinal mode spacing) that satisfies the phase condition of the external resonator type laser.

$$T_{mh} = \frac{\Delta G_{TM}}{\left|\frac{d\lambda_G}{dT} - \frac{d\lambda_{TM}}{dT}\right|} \qquad \text{Formula (2-4)}$$

Thus, in the related art, the temperature $T_{mh}$ at which mode hopping occurs is approximately 5° C. This is why mode hopping is more likely to occur. Therefore, once mode hopping occurs, the power fluctuates based on reflection characteristics of the grating, and specifically it fluctuates by 5% or more.

As can be seen from the above, in an actual operation, the external resonator type laser employing the conventional glass waveguide or FBG controls its temperature by using a Peltier element.

In contrast, the present invention uses the grating element that makes a denominator of Formula (2-4) small as a precondition. The denominator in Formula (2-4) is preferably set at 0.03 nm/° C. or lower. Specifically, examples of material for the optical material layer preferably include gallium arsenide (GaAs), lithium niobate (LN), lithium tantalate (LT), tantalum oxide ($Ta_2O_5$), zinc oxide (ZnO), aluminum oxide ($Al_2O_3$), magnesium oxide (MgO), niobium oxide ($Nb_2O_5$), and titanium oxide ($TiO_2$).

When five or less wavelengths satisfying the phase condition exist within the $\Delta\lambda_G$, the laser can operate under the stable lasing conditions even if mode hopping occurs.

That is, in the configuration of the present invention, for example, when using polarized light in the z axis of LN, the lazing wavelength changes at a rate of 0.1 nm/° C. relative to the change in temperature, based on the temperature characteristic of the grating, which makes it less likely to cause power variation even if mode hopping occurs. In the configuration of the present application, to increase $\Delta\lambda_G$, the grating length $L_b$ is set, for example, at 100 μm, whereas to increase $\Delta G_{TM}$, $L_a$ is set, for example, at 250 μm.

Note that the description of differences from Patent Document 6 will also be supplemented.

The present application is based on the premise that the temperature coefficient of the grating wavelength is made closer to the temperature coefficient of the gain curve of the semiconductor. From this point of view, the material having a refractive index of 1.8 or more is used. Furthermore, the groove depth $t_d$ of the grating is set at not less than 20 nm and not more than 250 nm, the reflectance thereof is set at not less than 3% nor more than 60%, and the full width at half maximum $\Delta\lambda_G$ thereof is set not less than 0.8 nm nor more than 250 nm. This arrangement can make the resonator structure compact and can achieve the temperature independency without adding any element. Patent Document 6 describes respective parameters as follows, all of which fall within the related art.

$\Delta\lambda_G$=0.4 nm
Longitudinal Mode Spacing $\Delta G_{TM}$=0.2 nm
Grating Length $L_b$=3 mm
LD Active Layer Length $L_a$=600 μm
Propagation Portion Length=1.5 mm The following respective conditions in the present invention will be described more specifically below.

$$0.8 \text{ nm} \leq \Delta\lambda_G \leq 6.0 \text{ nm} \quad (1)$$

$$10 \text{ μm} \leq L_b \leq 300 \text{ μm} \quad (2)$$

$$20 \text{ nm} \leq t_d \leq 250 \text{ nm} \quad (3)$$

The refractive index $n_b$ of the material forming the Bragg grating is preferably 1.7 or more, and more preferably 1.8 or more.

In the related art, material having a lower refractive index, such as quartz, is commonly used. However, in the idea of the present invention, the refractive index of the material forming the Bragg grating is enhanced. The reason for this is that the material having a high refractive index tends to significantly change its refractive index depending on the temperature, whereby $T_{mh}$ of Formula (2-4) can be increased, and as mentioned above, the temperature coefficient $d\lambda_G/dT$ of the grating can be increased. From this point of view, $n_b$ is further preferably 1.9 or more. The upper limit of $n_b$ is not particularly limited. However, any excessive refractive index $n_b$ leads to an excessively small grating pitch in design, making it difficult to form the grating. Thus, the refractive index $n_b$ is preferably 4 or less.

The full width at half maximum $\Delta\lambda_G$ of the peak of the Bragg reflectance is set at 0.8 nm or more (Formula 1), where $\lambda_G$ is the Bragg wavelength. That is, as shown in FIGS. 15 and 16, when the longitudinal axis represents the reflectance, and the lateral axis represents the reflection wavelength due to the Bragg grating, the wavelength at which the reflectance is maximized is referred to as the "Bragg wavelength". The full width at half maximum $\Delta\lambda_G$ is a difference between two wavelengths at which its reflectance is equal to half the maximum reflectance at the peak with the Bragg wavelength positioned at the center.

The full width at half maximum $\Delta\lambda_G$ of the peak of the Bragg reflectance is set at 0.8 nm or more (Formula 1). This is to make the peak of the reflectance broad. From this point of view, the full width at half maximum $\Delta\lambda_G$ is preferably set to 1.2 nm or more, and more preferably 1.5 nm or more. The full width at half maximum $\Delta\lambda_G$ is set to 5 nm or less, preferably 3 nm or less, and more preferably 2 nm or less.

The length $L_b$ of the Bragg grating is set at 300 μm or less (see Formula 2 and FIG. 9). The length $L_b$ of the Bragg grating is a grating length in the optical axis direction of light propagating through the optical waveguide. The length $L_b$ of the Bragg grating is set to 300 μm or less, which is shorter than in the related art. This is the premise on which the design idea of the present invention is based. That is, to suppress the occurrence of mode hopping, a spacing between wavelengths satisfying the phase condition (longitudinal mode spacing) needs to be larger. For this reason, it is necessary to shorten the length of the resonator, so that the length of the grating element is decreased. From this point of view, the length $L_b$ of the Bragg grating is more preferably 200 μm or less.

Shortening the length of the grating element leads to the reduced loss thereof, which can decrease the lazing threshold. Consequently, the laser can be driven at low current and with low heat generation and low energy.

The length $L_b$ of the grating is preferably 5 μm or more to attain the reflectance of 3% or higher, and more preferably 10 μm or more to attain the reflectance of 5% or higher.

In Formula (3), $t_d$ is a depth of each of the concave and convex portion forming the Bragg grating (see FIG. 4). By setting $t_d$ in a range of 20 nm to 250 nm (20 nm ≤ $t_d$ ≤ 250 nm), $\Delta\lambda_G$ can be set at not less than 0.8 nm nor more than 250 nm. The number of the longitudinal modes within the range $\Delta\lambda_G$ can be adjusted to be not less than 2 nor more than 5. From this point of view, $t_d$ is more preferably set at 30 nm or more, and further preferably 200 nm or less. To set the full width at half maximum at 3 nm or less, $t_d$ is preferably 150 nm or less.

In the preferred embodiments, in terms of promoting the lasing, the reflectance of the grating element is preferably set at not less than 3% nor more than 40%. The reflectance is more preferably 5% or more to further stabilize the output power, and more preferably 25% or less to increase the output power.

Figure 21:
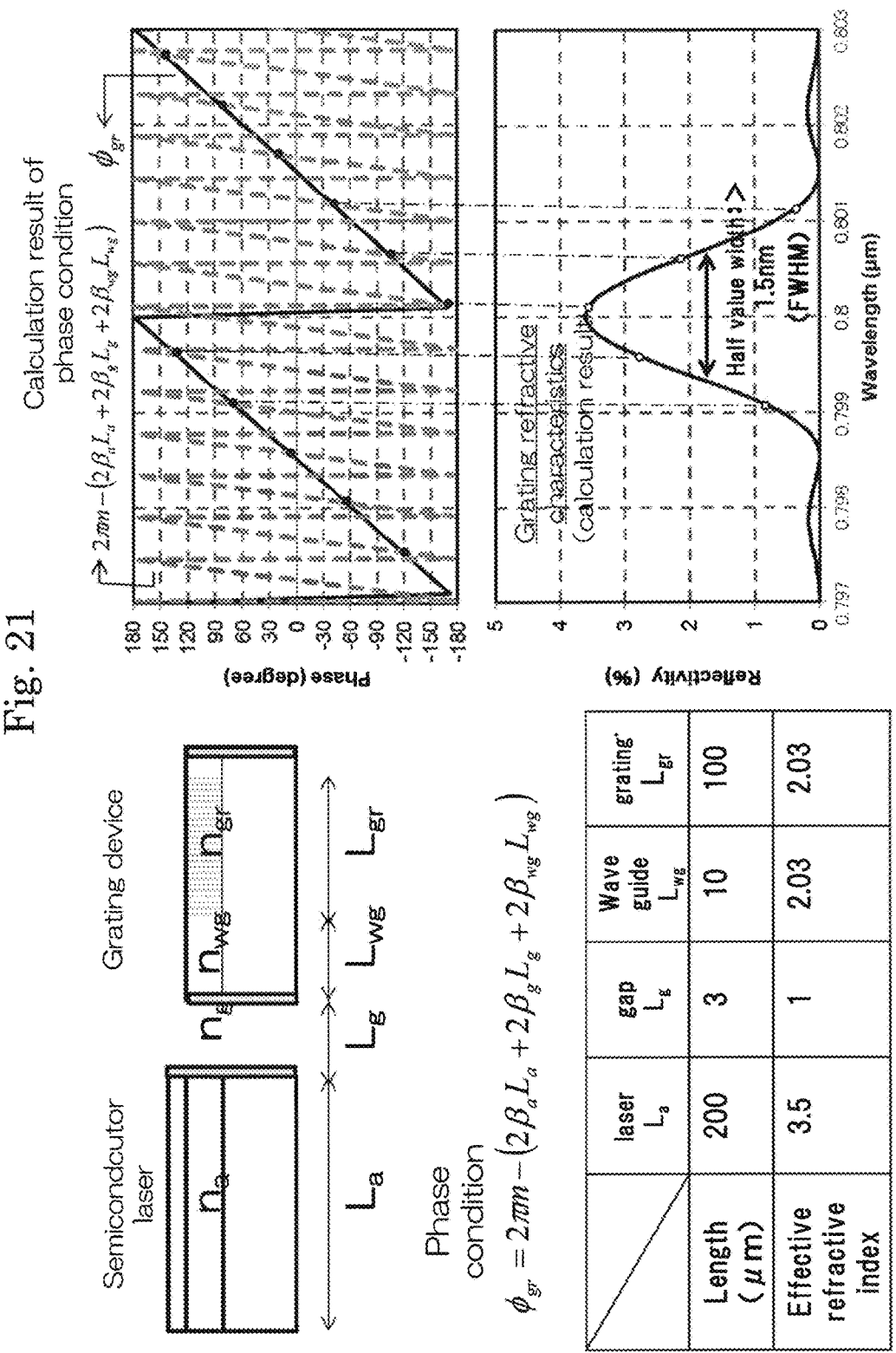
FIG. 21 shows an example of discrete phase conditions in the present invention.

As shown in FIG. 14, the lasing conditions are configured by the gain condition and the phase condition. The wavelengths satisfying the phase condition are discrete, and shown in, for example, FIG. 21. That is, in the configuration of the present application, the temperature coefficient of the gain curve (0.3 nm/° C. for GaAs) is made closer to the temperature coefficient $d\lambda_G/dT$ of the grating, so that the lasing wavelength can be fixed within the range $\Delta\lambda_G$. Further, when the number of longitudinal modes within the range $\Delta\lambda_G$ is not less than 2 nor more than 5, the lasing wavelength repeatedly shows mode hopping within the range $\Delta\lambda_G$, whereby the possibility of lasing outside the range $\Delta\lambda_G$ can be reduced. This can prevent the occurrence of significant mode hopping, and can operate the laser at a stable wavelength and with stable output power.

In the preferred embodiments, the length $L_a$ of the active layer is set at 500 µm or less (see FIG. 9). From this point of view, the length $L_a$ of the active layer is more preferably 300 µm or less. The length $L_a$ of the active layer is preferably set at 150 µm or more in terms of increasing the output from the laser.

In Formula (6), $d\lambda_G/dT$ is a temperature coefficient of the Bragg wavelength.

Furthermore, $d\lambda_{TM}/dT$ is the temperature coefficient of the wavelength satisfying the phase condition of the external resonator type laser.

Here, $\lambda_{TM}$ is the wavelength satisfying the phase condition of the external resonator type laser, that is, the wavelength satisfying the phase condition of Formula (2-3) described above. This is called the "longitudinal mode" in the present specification.

Now, the description of the longitudinal mode will be supplemented.

In Formula (2-3), β is $2\pi n_{eff}/\lambda$ (i.e. $\beta=2\pi n_{eff}/\lambda$)), $n_{eff}$ is an effective index therein, and λ satisfying this condition is $\lambda_{TM}$. $\Phi_2$ is a change in phase of the Bragg grating, and $\lambda_{TM}$ is shown in FIG. 15.

$\lambda G_{TM}$ is a spacing between the wavelengths (longitudinal mode spacing) satisfying the phase condition of the external resonator type laser. There is a plurality of the wavelengths $\lambda_{TM}$, which means the presence of a plurality of differences between the wavelengths $\lambda_{TM}$s.

Thus, by satisfying Formula (6), the temperature at which mode hopping occurs can be increased, thereby suppressing mode hopping in reality. Thus, the value of Formula (6) is more preferably 0.025 nm/° C.

In the preferred embodiments, the length $L_{WG}$ of the grating element is set at 600 µm or less (see FIG. 9). $L_{WG}$ is preferably 400 µm or less, and more preferably 300 µm or less. Furthermore, $L_{WG}$ is preferably 50 µm or more.

In the preferred embodiments, a length $L_g$ between the emission surface of the light source and the incidence surface of the optical waveguide is set at not less than 1 µm nor more than 10 µm (see FIG. 9). Thus, the stable oscillation is possible.

In the preferred embodiments, an entire length $L_m$ of the incident portion and tapered portion is set at 100 µm or less. Thus, the stable oscillation is promoted. The lower limit of the length $L_m$ of the propagation portion is preferably 10 µm or more, and more preferably 20 µm or more.

In terms of increasing the tolerance of axial misalignment relative to the light source, the width $W_{in}$ of the ridge optical waveguide in the incident portion (see FIGS. 10, 11, and 13) is preferably 1.5 times or more as large as the mode-field diameter $W_h$ in the horizontal direction of the laser light. The width $W_{in}$ of the ridge optical waveguide in the incident portion is more preferably 2.5 times or less as large as the mode-field diameter $W_h$ in the horizontal direction of the laser light.

In terms of increasing the tolerance of axial misalignment relative to the light source, the thickness $W_{inv}$ of the optical material layer in the incident portion (see FIG. 13) is preferably 1.5 times or more as large as the mode-field diameter $W_v$ in the vertical direction of the laser light. The thickness $W_{inv}$ of the optical material layer in the incident portion is preferably 2.5 times or less as large as the mode-field diameter $W_v$ in the vertical direction of the laser light.

The mode-field diameters in the horizontal direction and the vertical direction of the laser light are measured in the following way.

The term "mode-field diameter" as used herein is generally defined as a width of $1/e^2$ (where e is the base of natural logarithm: 2.71828) of the maximum (normally corresponding to the center of a core) in the light intensity distribution of the laser light, which is obtained by measurement. With regard to the laser light, the mode field has different sizes in the respective horizontal and vertical directions of the laser element, and thus the mode field is defined for each of the horizontal and vertical directions. For a concentric circular structure, like an optical fiber, the mode-field diameter is defined as the diameter of the structure.

With regard to the measurement of the optical intensity distribution, generally, the measurement of a beam profile using a near-infrared camera or the measurement of optical intensities by a knife edge can produce the light intensity distribution of spots of the laser light.

In the preferred embodiments, when $W_{inv}$ is the thickness of the optical material layer located in the incident portion, $W_{inv}/\lambda$ is set at 2 or more. A too thick optical material layer leads to a significant coupling loss. Thus, $W_{inv}/\lambda$ is preferably 3 or less.

When the wavelength of the laser light is 0.85 µm, $W_{inv}$ is not less than 1.7 µm nor more than 2.55 µm.

In the present invention, the width $W_{in}$ of the ridge optical waveguide located in the incident portion is larger than the width $W_{gr}$ of the ridge optical waveguide in the grating portion. Note that the term "width of the ridge optical waveguide" as used herein means an interval between two corners on the cross section of a ridge part at its upper surface, the ridge part forming the optical waveguide (see FIG. 5).

From the viewpoint of the present invention, $W_{in}/W_{gr}$ is preferably 1.5 or more, and more preferably 2 or more. Any excessive $W_{in}/W_{gr}$ tends to increase the substrate radiation in the Bragg grating. Thus, $W_{in}/W_{gr}$ is preferably set at 3.5 or less.

For example, when the wavelength of the laser light is 0.85 µm, the width of the ridge optical waveguide in the incident portion is preferably 5 µm or more, and also preferably 10 µm or less. The ridge width of the grating portion is preferably not less than 3λ nor more than 5λ. When the wavelength of the laser light is 0.85 µm, the ridge width is preferably 2.55 µm or more, and also 4.25 µm or less.

The incident portion and the grating portion are coupled together by the tapered portion. In the tapered portion, the ridge width $W_t$ is preferably decreased gradually from the incident portion toward the grating portion, and more preferably decreased in the form of linear function in the element longitudinal direction.

It is noted that the width $W_{out}$ of each of the emission portions 3e and 23e may be the same as the width $W_{gr}$ of the ridge optical waveguide in the grating element, but may be smaller than $W_{gr}$. $W_{out}/W_{gr}$ is preferably 1.0 or less, and may be 0.5 or less. $W_{out}/W_{gr}$ is preferably 0.7 or more in terms of the propagation efficiency.

If the width of the ridge optical waveguide in the grating portion is too decreased, it is found that the mode shape will be distorted, causing the substrate radiation and reducing the reflectance of the grating.

Figure 17:
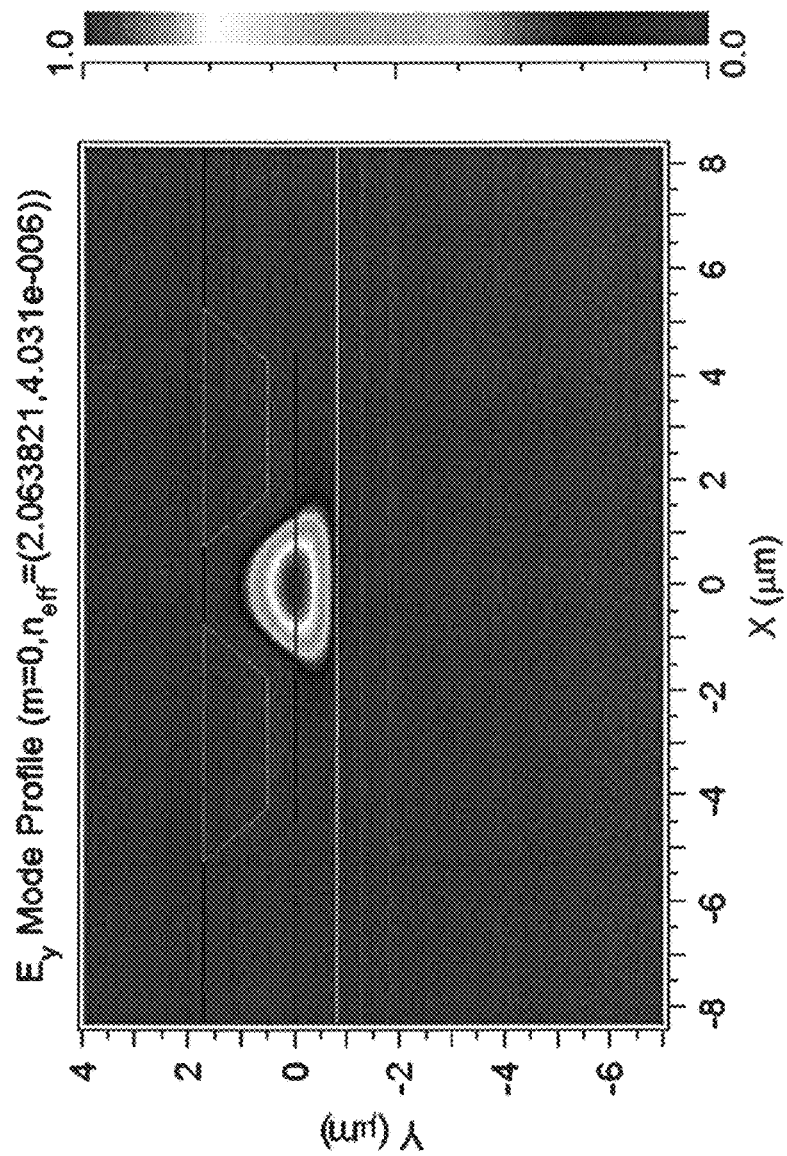
FIG. 17 is an example of a mode field pattern.

That is, when decreasing the ridge width to produce a single mode in the grating portion, the propagation light forms the spot shape such as that illustrated in FIG. 17. FIG. 17 shows the spot shape formed when the wavelength is 0.85

μm, and the ridge width is 2 μm. At this time, optical electric field leaks into the substrate, resulting in reduced optical electric field at the upper surface of the ridge. Thus, when forming the grating in the upper surface of the ridge waveguide, the stepped portion formed by the groove is less susceptible to the optical electric field, whereby the reflectance cannot be high.

Figure 18:
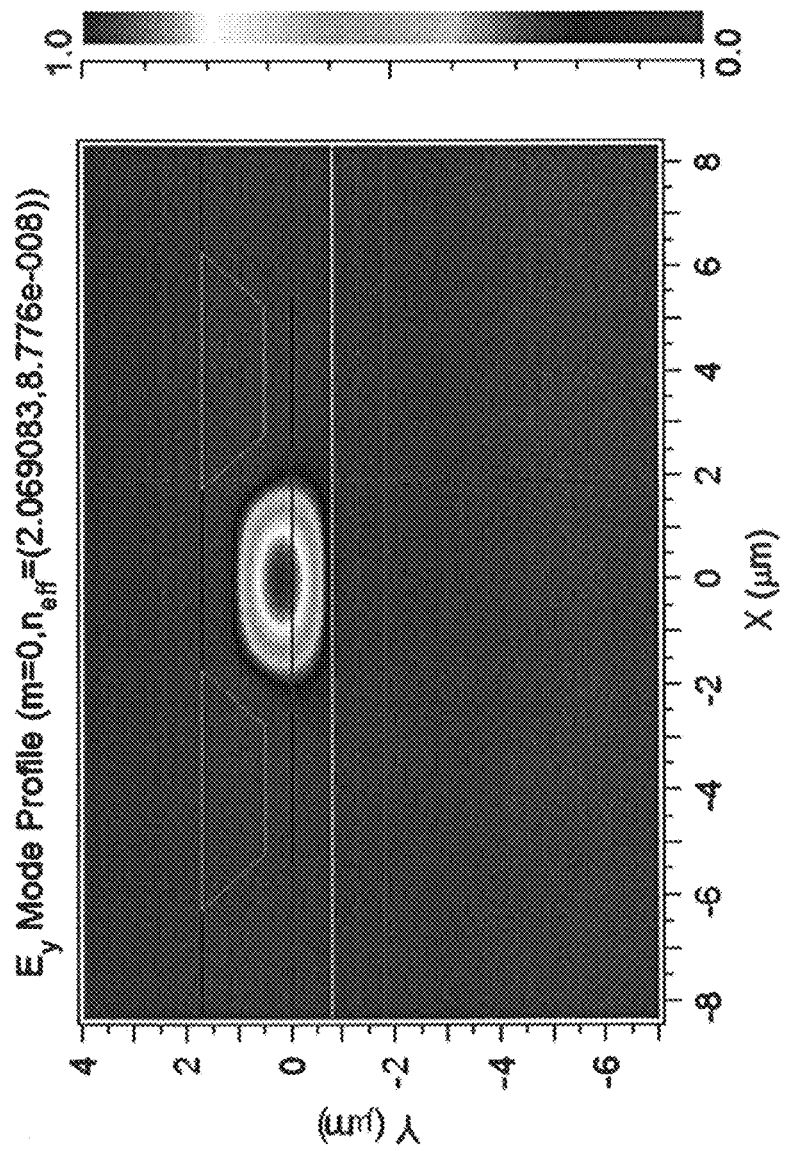
FIG. 18 is another example of a mode field pattern.

In contrast, FIG. 18 shows the spot shape formed when the width of the ridge optical waveguide is 3 μm. In this case, it shows that the spot shape is ellipsoidal and no leakage occurs into the substrate in the substrate mode.

Meanwhile, if the ridge width of the grating portion is too large, the laser is brought into the multi-mode, which means that there exists the optimal ridge width.

Figure 19:
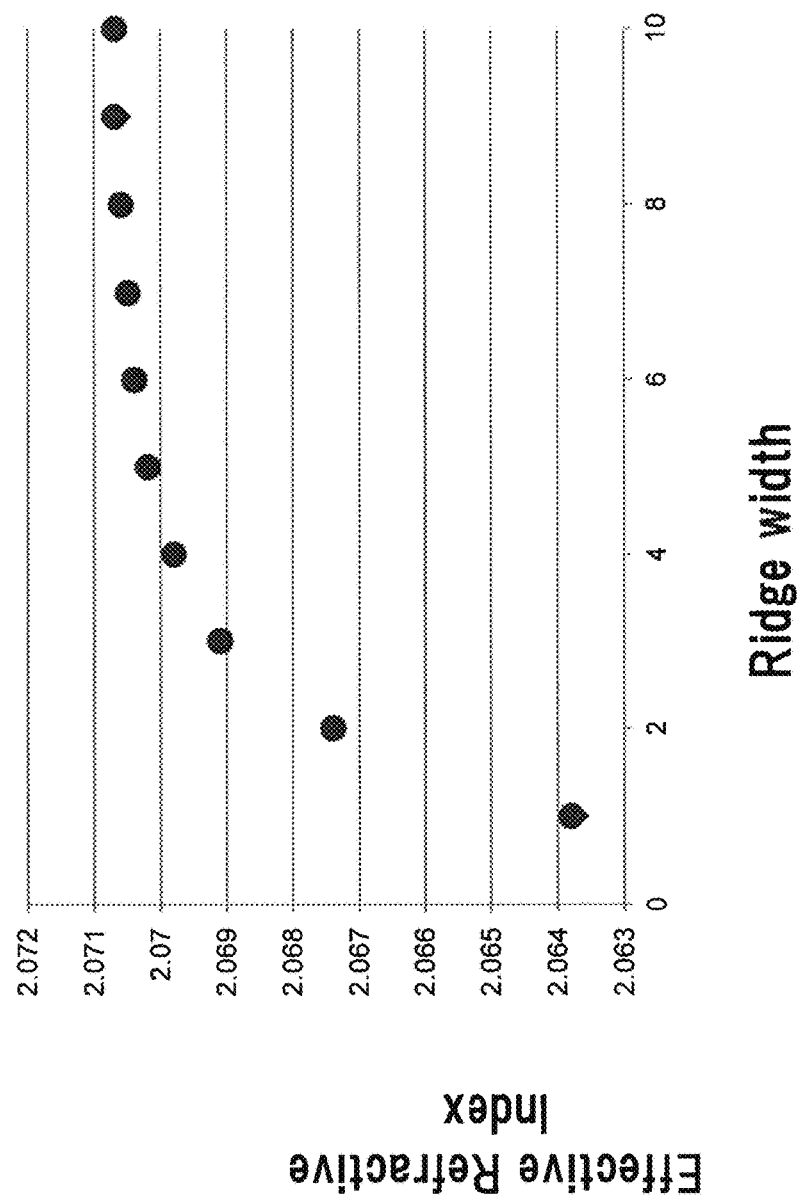
FIG. 19 is a graph showing the relationship between the width and effective index of a ridge optical waveguide.

FIG. 19 shows calculated values of the effective indexes of the waveguide in the fundamental mode that are obtained by changing the ridge width from 1 to 10 μm with the thickness $W_{inv}$ of the optical material layer set at 2 μm and $T_r$ set at 1.2 μm. Based on this result, a region with the ridge width of 1 μm or 2 μm is an initial rise region of the effective index, which is close to a cutoff region.

Figure 20:
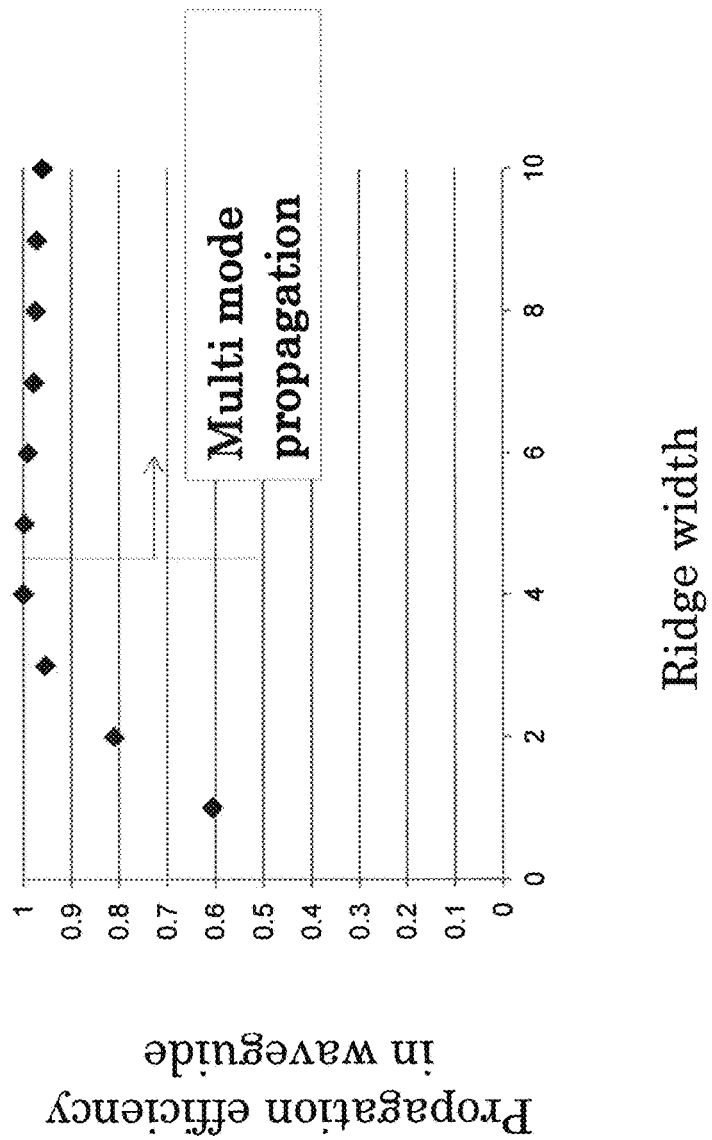
FIG. 20 is a graph showing the relationship between the width of the ridge optical waveguide and the propagation efficiency in the waveguide.

FIG. 20 is a calculated value of the propagation efficiency with the same ridge widths. As can be seen from the result, for the ridge widths 1 μm and 2 μm, the propagation efficiency is reduced due to radiation into the substrate in the substrate mode. For the ridge width of 5 μm or more, the propagation efficiency tends to decrease, which is due to the multi-mode.

To further improve the single mode characteristics of the grating portion, the thickness of the optical material layer in the grating portions 3d or 23d is set smaller than that of the optical material layer in the incident portions 3a or 23a (see FIG. 3(b) and FIG. 13).

From this viewpoint, the ratio of the thickness of the optical material layer in the grating portions 3d or 23d to the thickness of the optical material layer in the incident portions 3a and 23a ($W_{gr}/W_{inv}$) is preferably 1.0 or less, and may be 0.7 or less. In terms of the propagation efficiency, the ratio is preferably 0.3 or more.

EXAMPLES

Example 1

Grating elements shown in FIGS. 1(a), 2 and 4 was fabricated in the following way.

Specifically, SiO$_2$ was deposited in a thickness of 1 μm by a sputtering device on a support substrate 5 made of quartz, and Ta$_2$O$_5$ was deposited thereon in a thickness of 2 μm to form an optical material layer 1. Then, Ti was deposited on the optical material layer 1, and a grating pattern was fabricated by the photolithography technique.

Thereafter, grating grooves were formed at a pitch interval Λ of 205.4 nm with a length $L_b$ of 25 μm by fluorine reactive ion etching using the Ti pattern as a mask. The groove depth td of the grating was set to 100 nm. Further, a waveguide was patterned by the photolithography technique to form a pattern therein, and a ridge groove process was performed by reactive ion etching to form the incident portion with the width $W_{in}$ of 8 μm and the thickness $T_r$ of 1 μm as well as the grating portion with the width $W_{gr}$ of 3 μm and the thickness $T_r$ of 1 μm. The length from the incidence surface to the starting point of the grating portion was set at 25 μm.

Thereafter, the input side and output side of the element were etched down to the quartz substrate by dry etching to thereby make mirror surfaces at end faces thereof. Finally, SiO$_2$ was formed by sputtering to form a single-layer film of 90 nm in thickness at both end faces. At this time, the reflectance of the end face was 3%. The element size was set to have 1 mm width and 100 μm length $L_{wg}$.

Regarding the optical characteristics of the grating element, the reflection characteristics of the grating element were evaluated from the transmission characteristics by inputting the light in the TE mode into the grating element using the superluminescent diode (SLD), which was a broadband wavelength light source, followed by analyzing the outgoing light therefrom with an optical spectrum analyzer.

The measured reflection center wavelength of the grating element was 850 nm.

Next, as illustrated in FIGS. 8 and 9, a laser module was mounted. As a light source element, a conventional GaAs-based laser was used.

Specifications of the Light Source Element:
  Center Wavelength: 847 nm
  Output: 50 mW
  Full width at half maximum: 0.1 nm
  Length of laser element: 250 μm
Specifications of Mounting:
  $L_g$: 1 μm
  $W_{in}$: 8 μm
  $W_h$: 3 μm
  $W_{in}/W_h$: 2.7
  $W_{inv}$: 2 μm
  $W_v$: 1 μm
  $W_{inv}/W_v$: 2

After being mounted, the laser module was driven under current control (Automatic Current Control: ACC) without using a Peltier element. The laser module had the laser characteristics that it oscillated at a center wavelength of 850 nm, which corresponded to the reflection wavelength of the grating, and its output was 30 mW, which was smaller than without such a grating element. Variations in output were within 1%, so that the stable output characteristics were obtained. Subsequently, the temperature dependency of the laser module at the lasing wavelength was measured at operating temperatures in a temperature range from 20° C. to 40° C. As a result, the temperature coefficient of the laser module at the lasing wavelength was 0.05 nm/° C.

Comparative Example 1

A grating element having the same structure was formed in the same way as in Example 1. However, a ridge groove process was performed to form a light-source input portion with the width $W_{in}$ of 8 μm and the thickness $T_r$ of 1 μm as well as the grating portion with the width $W_{gr}$ of 8 μm and the thickness $T_r$ of 1 μm. The length from the input end face to the starting point of the grating portion was set at 25 μm.

Thereafter, the input side and output side of the element were etched down to the quartz substrate by dry etching to thereby make mirror surfaces at end faces thereof. Finally, SiO$_2$ was formed by sputtering to form a single-layer film of 90 nm in thickness at both end faces. At this time, the reflectance of the end face was 3%. The element size was set to have 1 mm width and 100 μm length $L_{wg}$.

Regarding the optical characteristics of the grating element, the reflection characteristics of the grating element were evaluated from the transmission characteristics by inputting the light in the TE mode into the grating element using the superluminescent diode (SLD), which was a broadband wavelength light source, followed by analyzing the outgoing light therefrom with the optical spectrum analyzer.

The measured reflection center wavelength of the grating element was 850 nm. However, reflection was also measured on the shorter wavelength side than this, i.e. at a plurality of wavelengths 845 nm, 840 nm, and 836 nm.

Next, as illustrated in FIG. 9, a laser module was mounted. As a light source element, a normal GaAs-based laser was used.

Specifications of the Light Source Element:
  Center Wavelength: 847 nm
  Output: 50 mW
  Full width at half maximum: 0.1 nm
  Length of laser element: 250 μm
Specifications of Mounting:
  $L_g$: 1 μm
  $W_{in}$: 8 μm
  $W_h$: 3 μm
  $W_{in}/W_h$: 2.7
  $W_{inv}$: 2 μm
  $W_v$: 1 μm
  $W_{inv}/W_v$: 2

After being mounted, the laser module was driven under current control (ACC) without using a Peltier element. The laser module had the laser characteristics that it oscillated at a center wavelength of 845 nm, which corresponded to the reflection wavelength of the grating, and its output was 30 mW, which was smaller than without such a grating element, but the substantially the same as in Example 1. Subsequently, the temperature dependency of the laser module at the lasing wavelength was measured at operating temperatures in a temperature range from 20° C. to 40° C. As a result, the temperature coefficient of the laser module at the lasing wavelength was 0.05 nm/° C. However, at around 30° C., the lasing wavelength significantly changed to 850.4 nm, causing a large change in output.

Example 2

A grating element having the same structure was formed in the same way as in Example 1. However, a ridge groove process was performed to form the light-source input portion with the width $W_{in}$ of 8 μm and the thickness $T_r$ of 1 μm as well as the grating portion with the width $W_{gr}$ of 2 μm and the thickness $T_r$ of 1 μm. The length from the input end face to the starting point of the grating portion was set at 25 μm.

Thereafter, the input side and output side of the element were etched down to the quartz substrate by dry etching to thereby make mirror surfaces at end faces thereof. Finally, SiO$_2$ was formed by sputtering to form a single-layer film of 90 nm in thickness at both end faces. At this time, the reflectance of the end face was 3%. The element size was set to have 1 mm width and 100 μm length $L_{wg}$.

Regarding the optical characteristics of the grating element, the reflection characteristics of the grating element were evaluated from the transmission characteristics by inputting the light in the TE mode into the grating element using the superluminescent diode (SLD), which was a broadband wavelength light source, followed by analyzing the outgoing light therefrom with the optical spectrum analyzer. The measured reflection center wavelength of the grating element was 849.5 nm.

Next, as illustrated in FIGS. 8 and 9, a laser module was mounted. As a light source element, a normal GaAs-based laser was used.

Specifications of the Light Source Element:
  Center Wavelength: 847 nm
  Output: 50 mW
  Full width at half maximum: 0.1 nm
  Length of laser element: 250 μm
Specifications of Mounting:
  $L_g$: 1 μm
  $W_{in}$: 8 μm
  $W_h$: 3 μm
  $W_{in}/W_h$: 2.7
  $W_{inv}$: 2 μm
  $W_v$: 1 μm
  $W_{inv}/W_v$: 2

After being mounted, the laser module was driven under current control (ACC) without using a Peltier element. The laser module had the laser characteristics that it oscillated at a center wavelength of 849.5 nm, which corresponded to the reflection wavelength of the grating, and its output was 10 mW, which was smaller than in Example 1. This is because the propagation loss became significant. However, variations in output were within 1%, so that the stable output characteristics were obtained. Subsequently, the temperature dependency of the laser module at the lasing wavelength was measured at operating temperatures in a temperature range from 20° C. to 40° C. As a result, the temperature coefficient of the laser module at the lasing wavelength was not varied, like Example 1, and was 0.05 nm/° C.

Example 3

Elements shown in FIGS. 1 (a) and 3 were fabricated in the following way.

Specifically, SiO$_2$ was deposited in a thickness of 2 μm by a sputtering device on a support substrate 5 made of quartz, and Ta$_2$O$_5$ was deposited thereon in a thickness of 2 μm to thereby form an optical material layer 1. Then, Ti was deposited on the optical material layer 1, and a grating pattern was fabricated by the photolithography technique. Thereafter, grating grooves were formed at a pitch interval Λ of 205.4 nm with a length $L_b$ of 25 μm by the fluorine reactive ion etching using the Ti pattern as a mask. The groove depth $t_d$ of the grating was set to 100 nm. Further, a waveguide was patterned by the photolithography technique to form a pattern therein, and a ridge groove process was performed by the reactive ion etching to form the incident portion with the width $W_{in}$ of 8 μm and the thickness $T_r$ of 1.6 μm as well as the grating portion with the width $W_{gr}$ of 3 μm and the thickness $T_r$ of 1.6 μm. The length from the input end face to the starting point of the grating portion was set at 25 μm.

Thereafter, the grating portion was subjected to the reactive ion etching while masking the input portion and the tapered portion, thereby reducing the thickness of the Ta$_2$O$_5$ film to 1 μm as a whole through the etching. In this way, as shown in FIG. 3(b), the thickness of the optical material layer in the grating element was smaller than that of the optical material layer in the incident portion and tapered portion. At this time, the groove depth td of the grating was set at 40 nm, while the groove depth of the ridge waveguide was set at 0.6 μm.

Subsequently, the input side and output side of the element were etched down to the quartz substrate by dry etching to thereby make mirror surfaces at end faces of the element. Finally, SiO$_2$ was formed by sputtering to form a single-layer film of 90 nm in thickness at both end faces. At this time, the reflectance of the end face was 3%. The element size was set to have 1 mm width and 100 μm length $L_{wg}$.

Regarding the optical characteristics of the grating element, the reflection characteristics of the grating element were evaluated from the transmission characteristics by inputting the light in the TE mode into the grating element using the superluminescent diode (SLD), which was a broadband wavelength light source, followed by analyzing the outgoing light therefrom with the optical spectrum analyzer.

The measured reflection center wavelength of the grating element was 848 nm.

Next, as illustrated in FIG. 9, a laser module was mounted. As a light source element, a normal GaAs-based laser was used.

Specifications of the Light Source Element:
    Center Wavelength: 847 nm
    Output: 50 mW
    Full width at half maximum: 0.1 nm
    Length of laser element: 250 μm Specifications of Mounting:
    $L_g$: 1 μm
    $W_{in}$: 8 μm
    $W_h$: 3 μm
    $W_{in}/W_h$: 2.7
    $W_{inv}$: 2 μm
    $W_v$: 1 μm
    $W_{inv}/W_v$: 2
    $W_{grv}$: 1 μm
    $W_{inv}/Wgrv$: 2

After being mounted, the laser module was driven under current control (ACC) without using a Peltier element. The laser module had the laser characteristics that it oscillated at a center wavelength of 848 nm, which corresponded to the reflection wavelength of the grating, and its output was 30 mW, which was smaller than without such a grating element. Variations in output were within 1%, so that the stable output characteristics were obtained. Subsequently, the temperature dependency of the laser module at the lasing wavelength was measured at operating temperatures in a temperature range from 20° C. to 40° C. As a result, the temperature coefficient of the laser module at the lasing wavelength was 0.05 nm/° C.

As an additional experiment, the tolerance of axial misalignment between the semiconductor laser and the grating element was measured. First, the semiconductor laser as a light source element and the grating element was installed on an optical alignment device, and the optical axis were adjusted to maximize the amount of light output from the grating element. From this state, the axis was shifted every 0.1 μm only in the horizontal direction, followed by measuring changes in the amount of light. The tolerance of axial misalignment in the horizontal direction was defined as an amount of axial misalignment produced when the amount of light was 25 mW. The tolerance of axial misalignment in the vertical direction was also measured in the same way, thus measuring the amount of axial misalignment.

The measurement results in Examples 1, 3, and Comparative Example 1 were as follows.

TABLE 1

| | Tolerance of axial misalignment | |
|---|---|---|
| | Horizontal direction | Vertical direction |
| Example 1 | ±2 | ±0.8 |
| Example 3 | ±2 | ±0.8 |//

TABLE 1-continued

| | Tolerance of axial misalignment | |
|---|---|---|
| | Horizontal direction | Vertical direction |
| Comparative Example 1 | ±2 | ±0.8 |

Units (μm)

Comparative Example 2

A grating element was formed in the same way as in Example 1, and then the laser module illustrated in FIG. 9 was mounted.

Specifications of the Light Source Element:
    Center Wavelength: 847 nm
    Output: 50 mW
    Full width at half maximum: 0.1 nm
    Length of laser element: 250 μm Specifications of Mounting:
    $L_g$: 1 μm
    $W_{in}$: 3 μm
    $W_h$: 3 μm
    $W_{in}/W_h$: 1
    $W_{inv}$: 2 μm
    $W_v$: 1 μm
    $W_{inv}/W_v$: 2

As a result, the measurements of the tolerance of axial misalignment for this element were ±1.3 μm in the horizontal direction and ±0.8 μm in the vertical direction.

After being mounted, the laser module was driven under current control (ACC) without using a Peltier element. The laser module had the laser characteristics that it oscillated at a center wavelength of 850 nm, which corresponded to the reflection wavelength of the grating, and its output was 30 mW. Variations in output were within 1%, so that the stable output characteristics were obtained. Subsequently, the temperature dependency of the laser module at the lasing wavelength was measured at operating temperatures in a temperature range from 20° C. to 40° C. As a result, the temperature coefficient of the laser module at the lasing wavelength was not varied, like Example 1, and was 0.05 nm/° C.

Comparative Example 3

Next, an element illustrated in FIGS. 1(a) and 3 was fabricated, and then a laser module was mounted as illustrated in FIG. 9.

Specifications of the Light Source Element:
    Center Wavelength: 847 nm
    Output: 50 mW
    Full width at half maximum: 0.1 nm
    Length of laser element: 250 μm Specifications of Mounting:
    $L_g$: 1 μm
    $W_{in}$: 3 μm
    $W_h$: 3 μm
    $W_{in}/W_h$: 1
    $W_{inv}$: 2 μm
    $W_v$: 1 μm
    $W_{inv}/W_v$: 2
    $W_{grv}$: 1 μm
    $W_{inv}/W_{grv}$: 2

As a result, the measurements of the tolerance of axial misalignment for this element were ±1.3 µm in the horizontal direction and ±0.8 µm in the vertical direction.

After being mounted, the laser module was driven under current control (ACC) without using a Peltier element. The laser module had the laser characteristics that it oscillated at a center wavelength of 848 nm, which corresponded to the reflection wavelength of the grating, and its output was 30 mW. Variations in output were within 1%, so that the stable output characteristics were obtained. Subsequently, the temperature dependency of the laser module at the lasing wavelength was measured at operating temperatures in a temperature range from 20° C. to 40° C. As a result, the temperature coefficient of the laser module at the lasing wavelength was 0.05 nm/° C.

Comparative Example 4

A grating element was formed in the same way as in Example 1, and then the laser module illustrated in FIG. 9 was mounted.
Specifications of the Light Source Element:
  Center Wavelength: 847 nm
  Output: 50 mW
  Full width at half maximum: 0.1 nm
  Length of laser element: 250 µm
Specifications of Mounting:
  $L_g$ 1 µm
  $W_{in}$: 3 µm
  $W_h$: 3 µm
  $W_{in}/W_h$: 1
  $W_{inv}$: 1 µm
  $W_v$: 1 µm
  $W_{inv}/W_v$: 1

As a result, the measurements of the tolerance of axial misalignment for this element were ±1.3 µm in the horizontal direction and ±0.4 µm in the vertical direction.

After being mounted, the laser module was driven under current control (ACC) without using a Peltier element. The laser module had the laser characteristics that it oscillated at a center wavelength of 848 nm, which corresponded to the reflection wavelength of the grating, and its output was 35 mW. Variations in output were within 1%, so that the stable output characteristics were obtained. Subsequently, the temperature dependency of the laser module at the lasing wavelength was measured at operating temperatures in a temperature range from 20° C. to 40° C. As a result, the temperature coefficient of the laser module at the lasing wavelength was not varied, like Example 1, and was 0.05 nm/° C.

The invention claimed is:
1. An external resonator type light emitting device, comprising:
  a light source for oscillating a laser light; and
  a grating element forming an external resonator together with said light source,
  wherein said light source includes an active layer oscillating said laser light whose transverse mode is of single mode;
  said grating element comprising:
  a support substrate;
  an optical material layer disposed over said support substrate;
  a ridge optical waveguide disposed in said optical material layer, said ridge optical waveguide having an incidence surface to which a laser light is incident and an emission end from which an emission light with a desired wavelength is emitted; and
  a Bragg grating comprising concave and convex portions formed within said ridge optical waveguide,
  wherein said ridge optical waveguide comprises an incident portion disposed between said incidence surface and said Bragg grating, and a tapered portion disposed between said incident portion and said Bragg grating,
  wherein a propagating light propagates in said ridge optical waveguide in a single mode,
  wherein said tapered portion has a first end having a first width and a second end having a second width less than the first width, the first end being in contact with said incident portion,
  wherein a width of said ridge optical waveguide in said incident portion is larger than a width of said ridge optical waveguide in said Bragg grating,
  wherein a width of said ridge optical waveguide in said tapered portion is decreased from said incident portion toward said Bragg grating,
  wherein said width of said ridge optical waveguide in said incident portion is 1.5 times or more of a mode-field diameter in a horizontal direction of said laser light, and
  wherein relationships represented by formulas (1) to (5) below are satisfied:

$$0.8 \text{ nm} \leq \Delta\lambda_G \leq 6.0 \text{ nm} \tag{1}$$

$$10 \text{ µm} \leq L_b \leq 300 \text{ µm} \tag{2}$$

$$20 \text{ nm} \leq t_d \leq 250 \text{ nm} \tag{3}$$

$$n_b \geq 1.8 \tag{4}$$

$$L_{WG} \leq 500 \text{ µm} \tag{5}$$

$\Delta\lambda_G$ in said formula (1) is a full width at half maximum of a peak of a Bragg reflectance in said Bragg grating;
$L_b$ in said formula (2) is a length of said Bragg grating;
$t_d$ in said formula (3) is a depth of each of said concave and convex portions forming said Bragg grating;
$n_b$ in said formula (4) is a refractive index of a material forming said optical material layer; and
$L_{WG}$ in said formula (5) is a length of said grating element.

2. The external resonator type light emitting device of claim 1,
  wherein a thickness of said optical material layer in said incident portion is larger than a thickness of said optical material layer in said Bragg grating, and
  wherein a thickness of said optical material layer in said tapered portion is decreased from said incident portion toward said Bragg grating.

3. The external resonator type light emitting device of claim 1,
  wherein $W_{inv}/\lambda$ is not less than 2 nor more than 3 where $\lambda$ is a wavelength of said laser light, and $W_{inv}$ is a thickness of said optical material layer at least in said incident portion, and
  wherein said width of said ridge optical waveguide in said Bragg grating is not less than $3\lambda$ nor more than $5\lambda$.

4. The external resonator type light emitting device of claim 3,
  wherein $W_{grv}/\lambda$ is not less than 1 nor more than 2 where $W_{grv}$ is a thickness of said optical material layer in said Bragg grating, and $\lambda$ is said wavelength of said laser light.

5. The external resonator type light emitting device of claim 1, wherein a single-layer film is formed on at least one of said incidence surface and said emission end, said single-layer film being made of a material having a lower refractive index than a refractive index of said material forming said optical material layer.

6. The external resonator type light emitting device of claim 1,
wherein a thickness of said optical material layer in said incident portion is 1.5 times or more of a mode-field diameter in a vertical direction of said laser light.

7. The external resonator type light emitting device of claim 1,
wherein a number of wavelengths capable of satisfying a phase condition of lasing within a full width at half maximum $\Delta\lambda_G$ is not less than 2 nor more than 5.

8. The external resonator type light emitting device of claim 1,
wherein a relationship represented by formula (6) below is satisfied:

$$\left|\frac{d\lambda_G}{dT} - \frac{d\lambda_{TM}}{dT}\right| \leq 0.03 \text{ nm/}° \text{ C.} \quad (6)$$

wherein said formula (6), $d\lambda_G/dT$ is a temperature coefficient of a Bragg wavelength, and
$d\lambda_{TM}/dT$ is a temperature coefficient of a wavelength satisfying a phase condition of an external resonator laser.

9. A An external resonator type light emitting device, comprising:
a light source for oscillating a laser light; and
a grating element forming an external resonator together with said light source,
wherein said light source includes an active layer oscillating said laser light whose transverse mode is of single mode;
said grating element comprising:
a support substrate;
an optical material layer disposed over said support substrate;
a ridge optical waveguide disposed in said optical material layer, said ridge optical waveguide having an incidence surface on which a laser light is incident and an emission end from which an emission light with a desired wavelength is emitted; and
a Bragg grating comprising concave and convex portions formed within said ridge optical waveguide,
wherein said ridge optical waveguide comprises an incident portion disposed between said incidence surface and said Bragg grating, and a tapered portion disposed between said incident portion and said Bragg grating,
wherein a propagation light propagates in said ridge optical waveguide in a single mode,
wherein said tapered portion has a first end having a first width and a second end having a second width less than the first width, the first end being in contact with said incident portion,
wherein a width of said ridge optical waveguide in said incident portion is larger than a width of said ridge optical waveguide in said Bragg grating,
wherein a width of said ridge optical waveguide in said tapered portion is decreased from said incident portion toward said Bragg grating,
wherein said width of said ridge optical waveguide in said incident portion is 1.5 times or more of a mode-field diameter in a horizontal direction of said laser light,
wherein relationships represented by formulas (1), (2), (3) and (5) below are satisfied, and
wherein a material forming said optical material layer is selected from said group consisting of gallium arsenide, lithium niobate single crystal, tantalum oxide, zinc oxide, aluminum oxide, lithium tantalate, magnesium oxide, niobium oxide, and titanium oxide, $$0.8 \text{ nm} \leq \Delta\lambda_G \leq 6.0 \text{ nm} \quad (1)$$

$$10 \text{ µm} \leq L_b \leq 300 \text{ µm} \quad (2)$$

$$20 \text{ nm} \leq t_d \leq 250 \text{ nm} \quad (3)$$

$$L_{WG} \leq 500 \text{ µm} \quad (5)$$

where $\Delta\lambda_G$ in said formula (1) is a full width at half maximum of a peak of a Bragg reflectance in said Bragg grating;
$L_b$ in said formula (2) is a length of said Bragg grating;
$t_d$ in said formula (3) is a depth of each of said concave and convex portions forming said Bragg grating; and
$L_{WG}$ in said formula (5) is a length of said grating element.

10. The external resonator type light emitting device of claim 9,
wherein a thickness of said optical material layer in said incident portion is larger than a thickness of said optical material layer in said Bragg grating, and
wherein a thickness of said optical material layer in said tapered portion is decreased from said incident portion toward said Bragg grating.

11. The external resonator type light emitting device of claim 9,
wherein $W_{inv}/\lambda$ is not less than 2 nor more than 3 where $\lambda$ is a wavelength of said laser light, and $W_{inv}$ is a thickness of said optical material layer at least in said incident portion, and
wherein said width of said ridge optical waveguide in said Bragg grating is not less than 3$\lambda$ nor more than 5$\lambda$.

12. The external resonator type light emitting device of claim 11,
wherein $W_{grv}/\lambda$ is not less than 1 nor more than 2 where $W_{grv}$ is a thickness of said optical material layer in said Bragg grating, and $\lambda$ is said wavelength of said laser light.

13. The external resonator type light emitting device of claim 9,
wherein a single-layer film is formed on at least one of said incidence surface and said emission end, said single-layer film being made of a material having a lower refractive index than a refractive index of said material forming said optical material layer.

14. The external resonator type light emitting device of claim 9,
wherein a thickness of said optical material layer in said incident portion is 1.5 times or more of a mode-field diameter in a vertical direction of said laser light.

15. The external resonator type light emitting device of claim 9,
wherein a number of wavelengths capable of satisfying a phase condition of lasing within a full width at half maximum $\Delta\lambda_G$ is not less than 2 nor more than 5.

16. The external resonator type light emitting device of claim 9, wherein a relationship represented by formula (6) below is satisfied:

$$\left| \frac{d\lambda_G}{dT} - \frac{d\lambda_{TM}}{dT} \right| \leq 0.03 \text{ nm/}^\circ \text{C.} \quad (6)$$

wherein said formula (6), $d\lambda_G/dT$ is a temperature coefficient of a Bragg wavelength, and
$d\lambda_{TM}/dT$ is a temperature coefficient of a wavelength satisfying a phase condition of an external resonator laser.

* * * * *